United States Patent [19]

Itakura

[11] Patent Number: 5,469,092
[45] Date of Patent: Nov. 21, 1995

[54] ELECTRONIC CIRCUIT INCLUDING MEANS FOR REFLECTING SIGNAL CURRENT AND FEED FORWARD MEANS FOR COMPENSATING OPERATIONAL SPEED THEREOF

[75] Inventor: Tetsuro Itakura, Tokyo, Japan

[73] Assignee: Kabushiki Kaisha Toshiba, Kawasaki, Japan

[21] Appl. No.: 305,471

[22] Filed: Sep. 13, 1994

[30] Foreign Application Priority Data

Sep. 13, 1993 [JP] Japan .................................. 5-226818
Jun. 24, 1994 [JP] Japan .................................. 6-142091

[51] Int. Cl.$^6$ ................................................ H02M 11/00
[52] U.S. Cl. ............................................................ 327/103
[58] Field of Search ................................ 323/315; 327/103, 327/356, 538

[56] References Cited

PUBLICATIONS

Op et al., "A CMOS Wideband Amplifier with 800 MHZ Gain–Bandwidth", IEEE Custom Integrated Circuits Conference Proceedings, 1991, pp. 9.1.1–9.1.4.

Primary Examiner—Timothy P. Callahan
Assistant Examiner—Jeffrey Zweizig
Attorney, Agent, or Firm—Foley & Lardner

[57] ABSTRACT

An electronic circuit having a signal current reflection element, includes a low pass filter for limiting a bandwidth of a control signal which is supplied to a gate of a transistor to which at least an input current is flowing in a current mirror circuit as the signal current reflection element, and a feedforward signal path including a capacitance which is provided between an input terminal of the current mirror circuit and other terminal of the electronic circuit including the current mirror circuit. Accordingly, it is possible to provide the electronic circuit having a miniaturized circuit scale of the current mirror circuit without using a gate grounded circuit and a bias circuit thereof, and an elective high frequency characteristic.

10 Claims, 29 Drawing Sheets

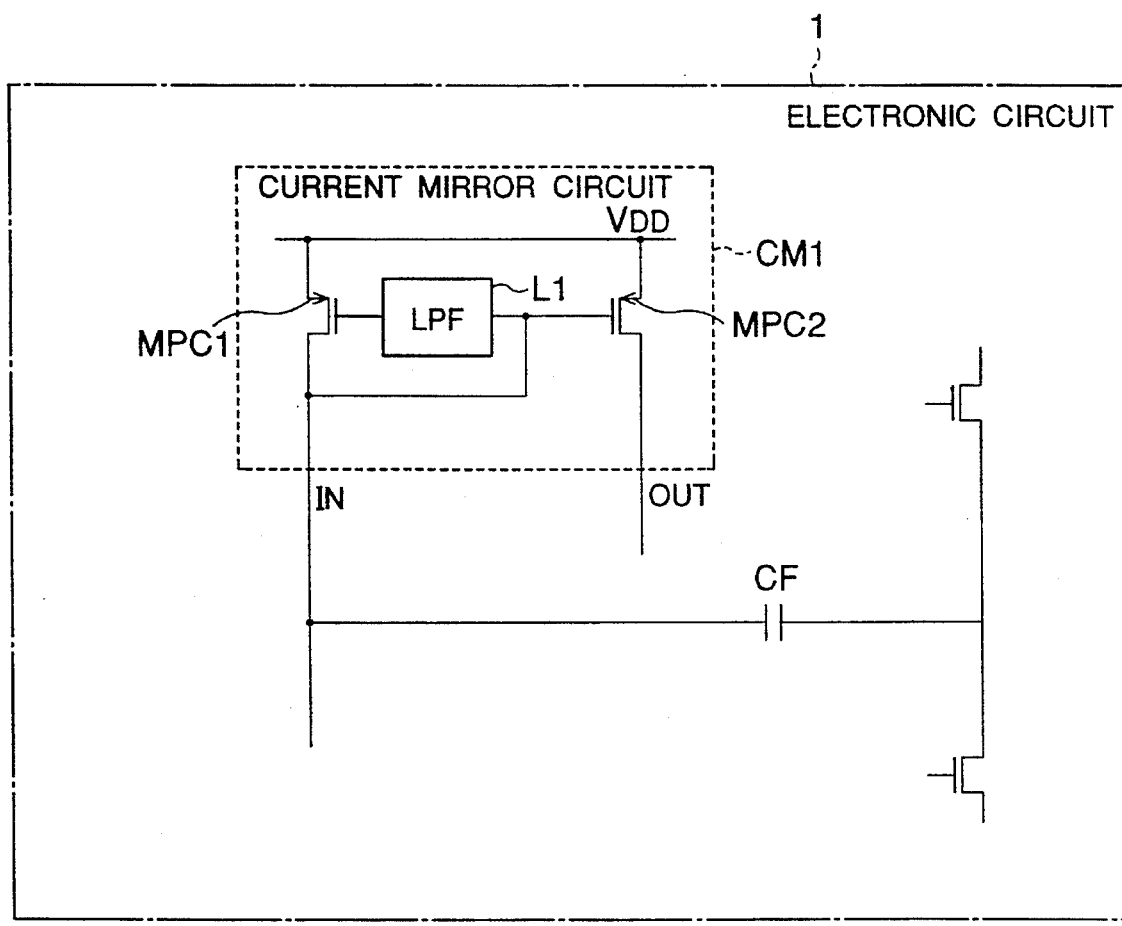
F I G. 4

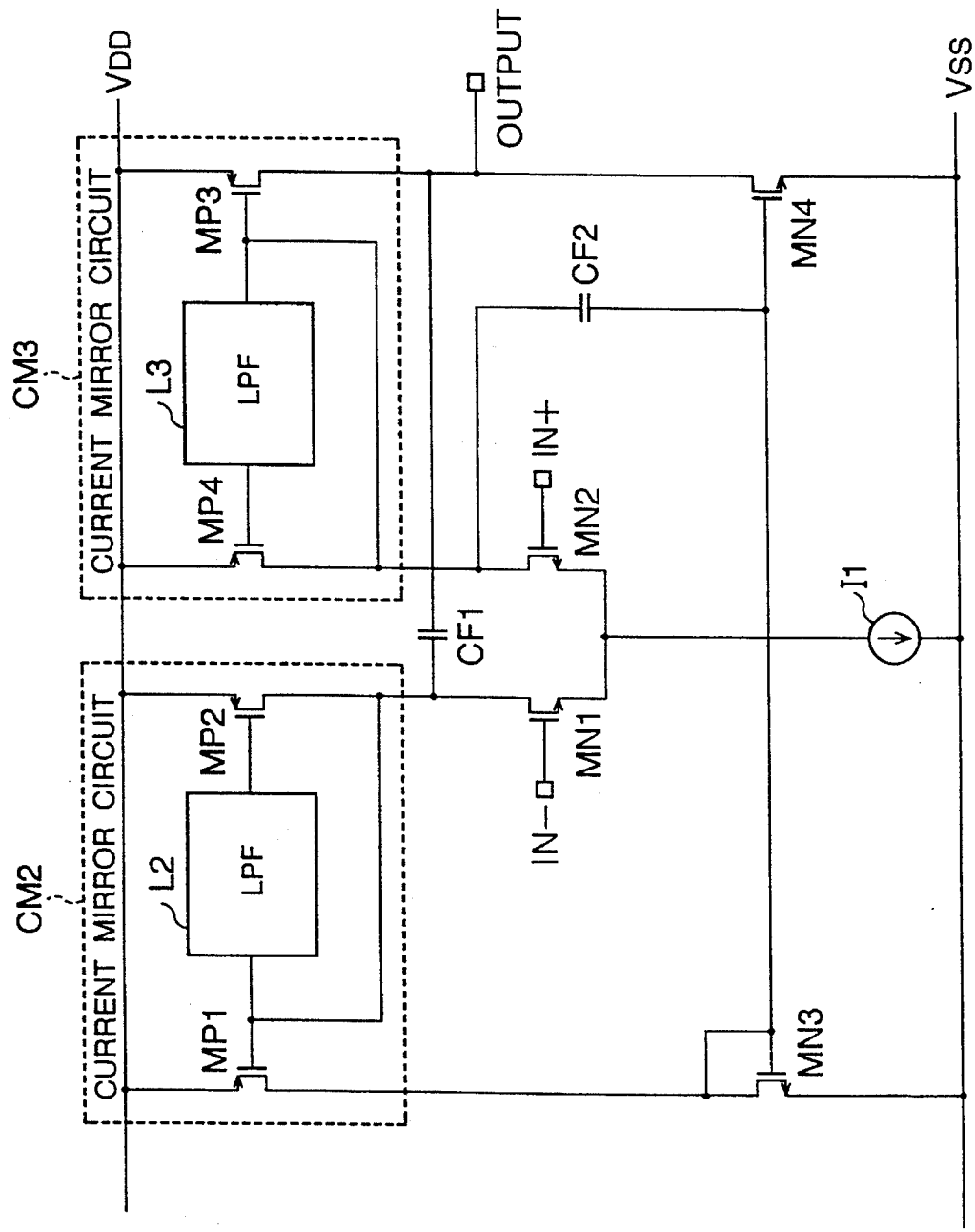
F I G. 5

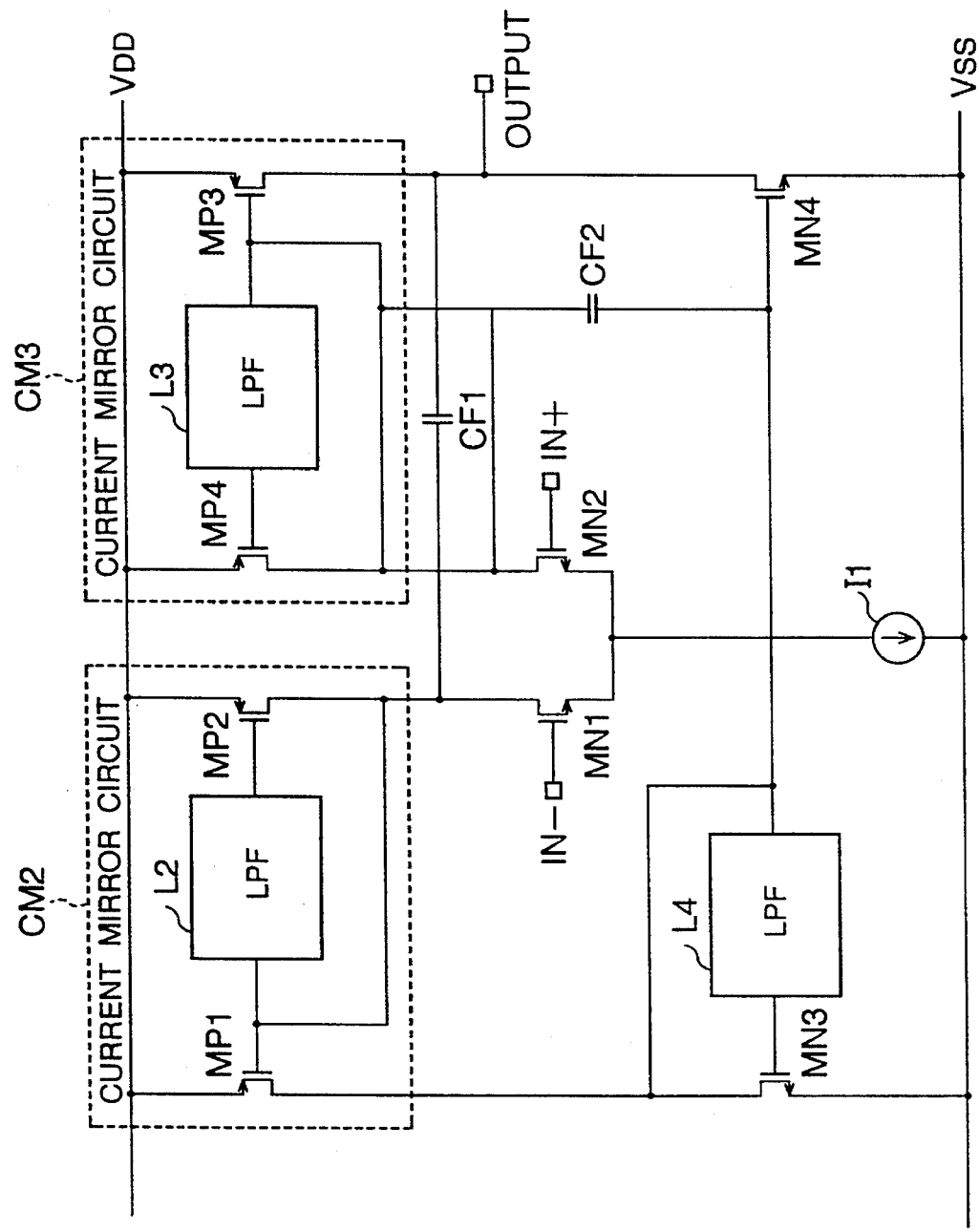
F I G. 6

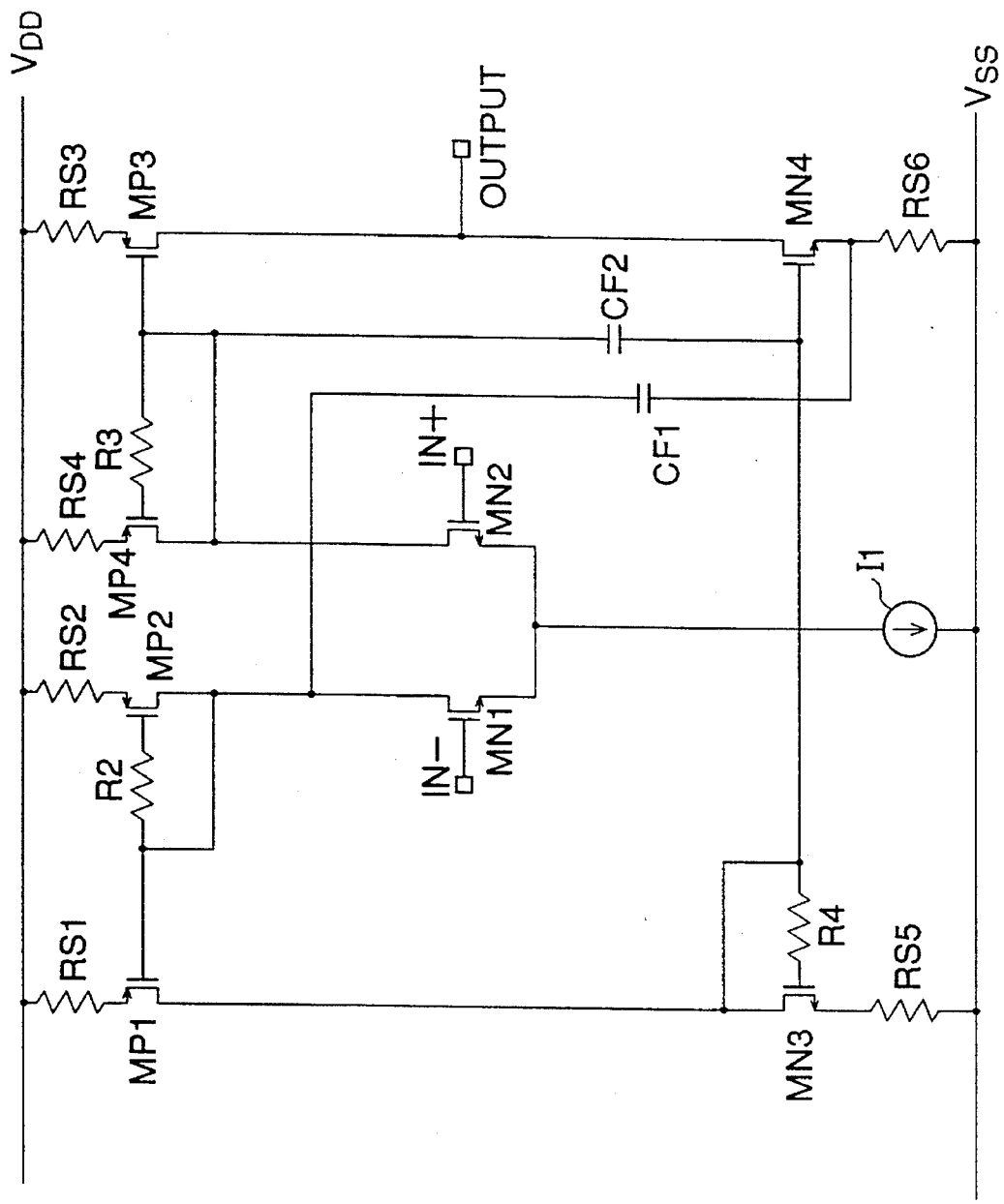
F I G. 10

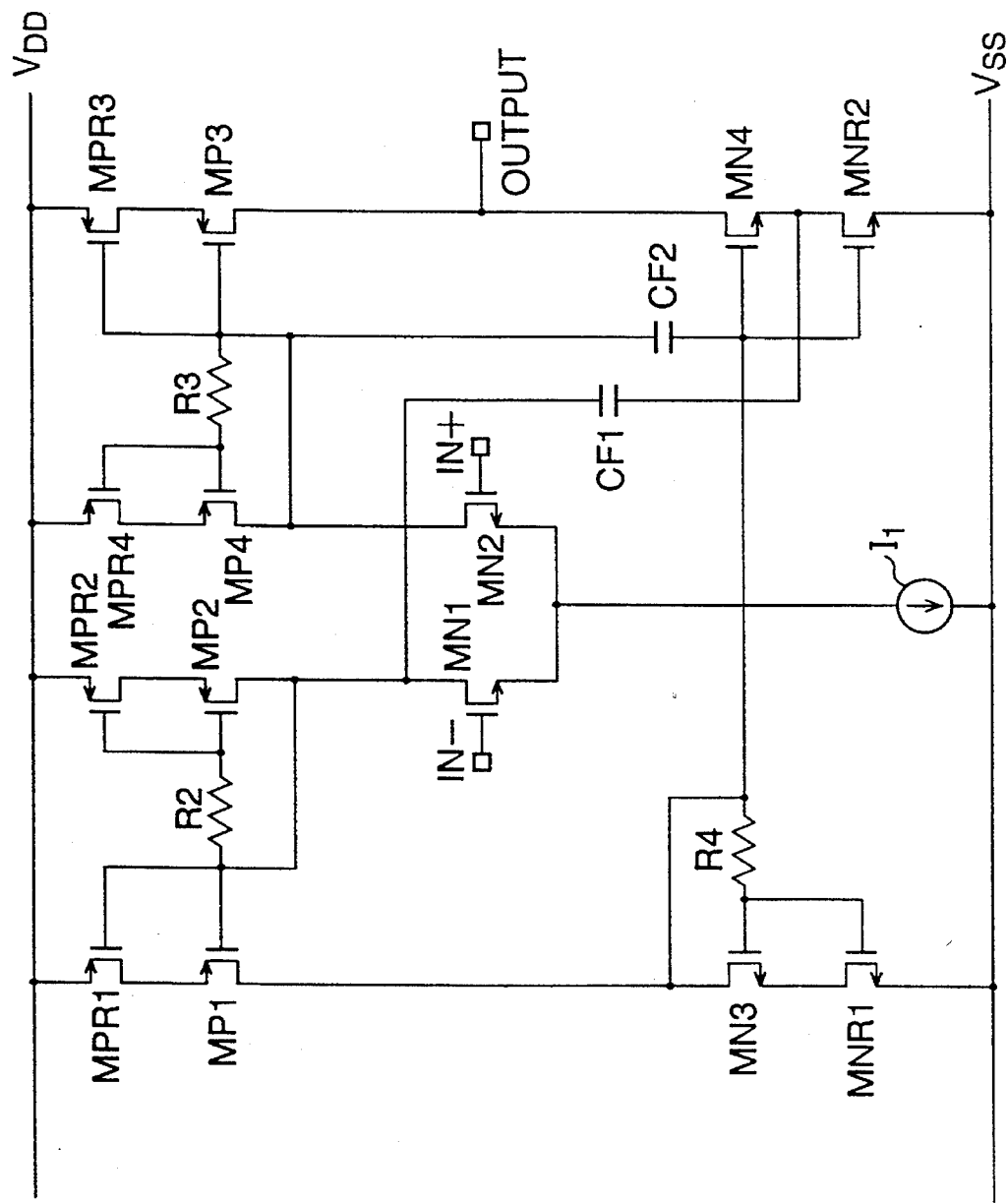
F I G. 11

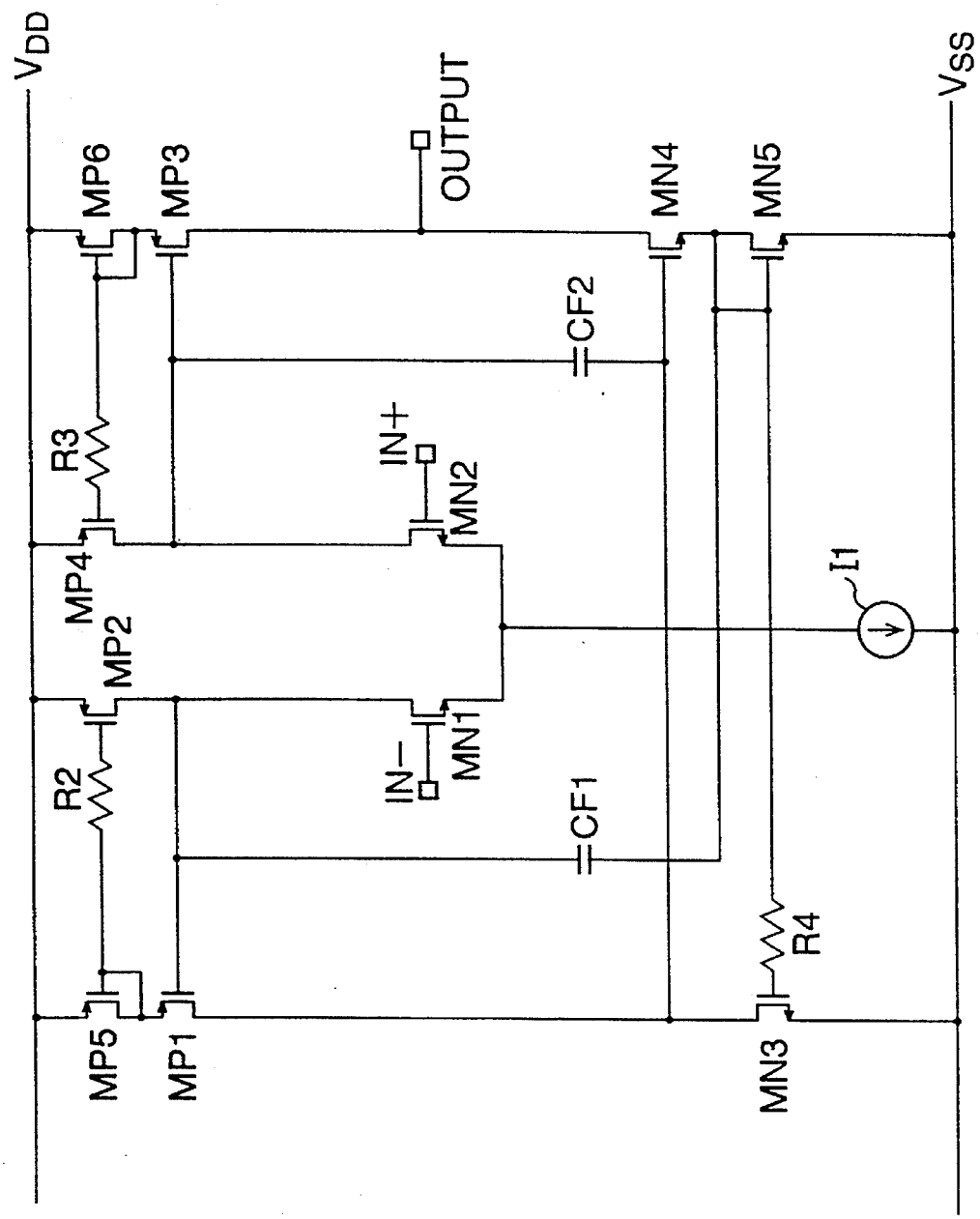
F I G. 1 4

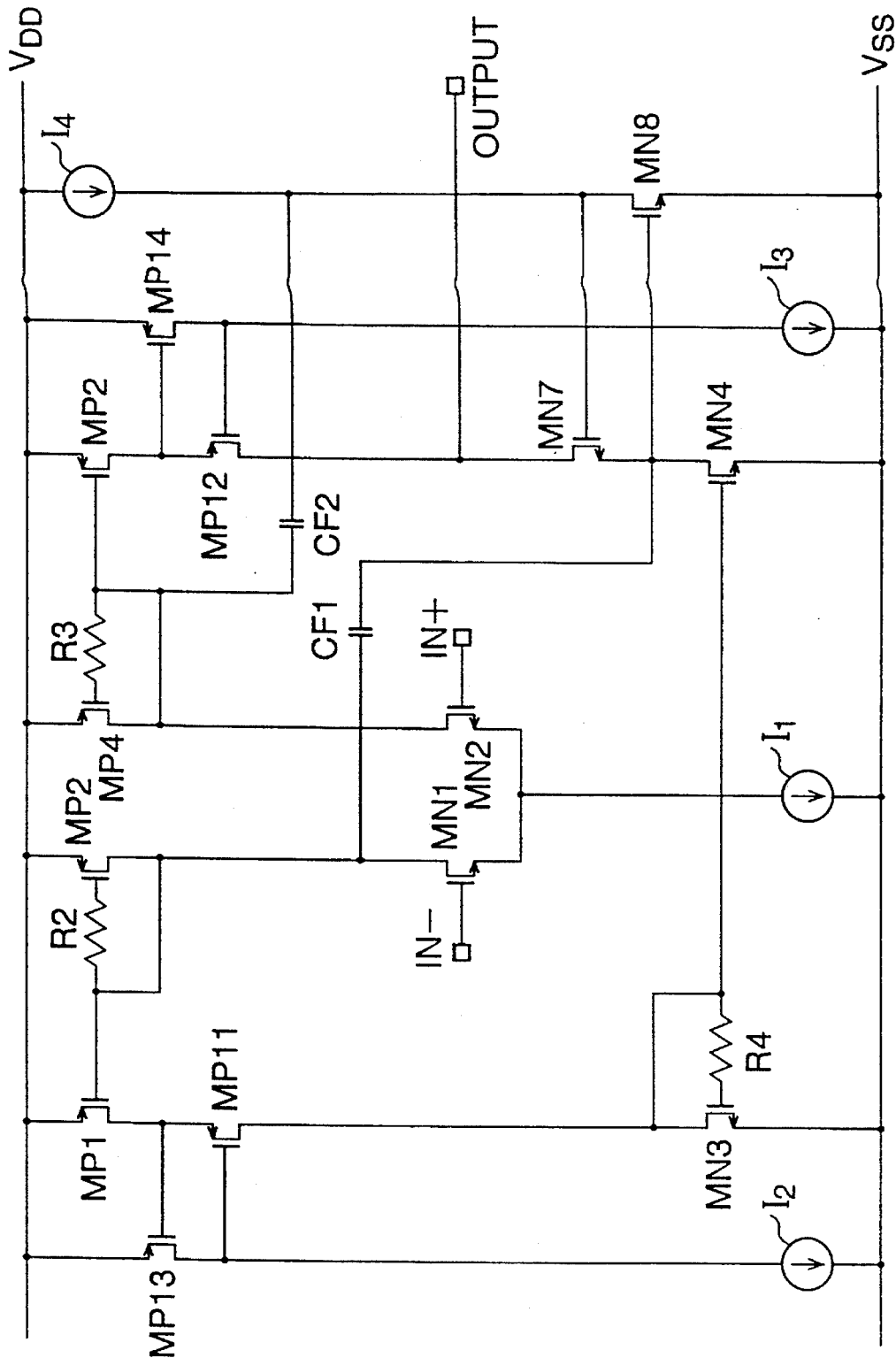
F I G. 16

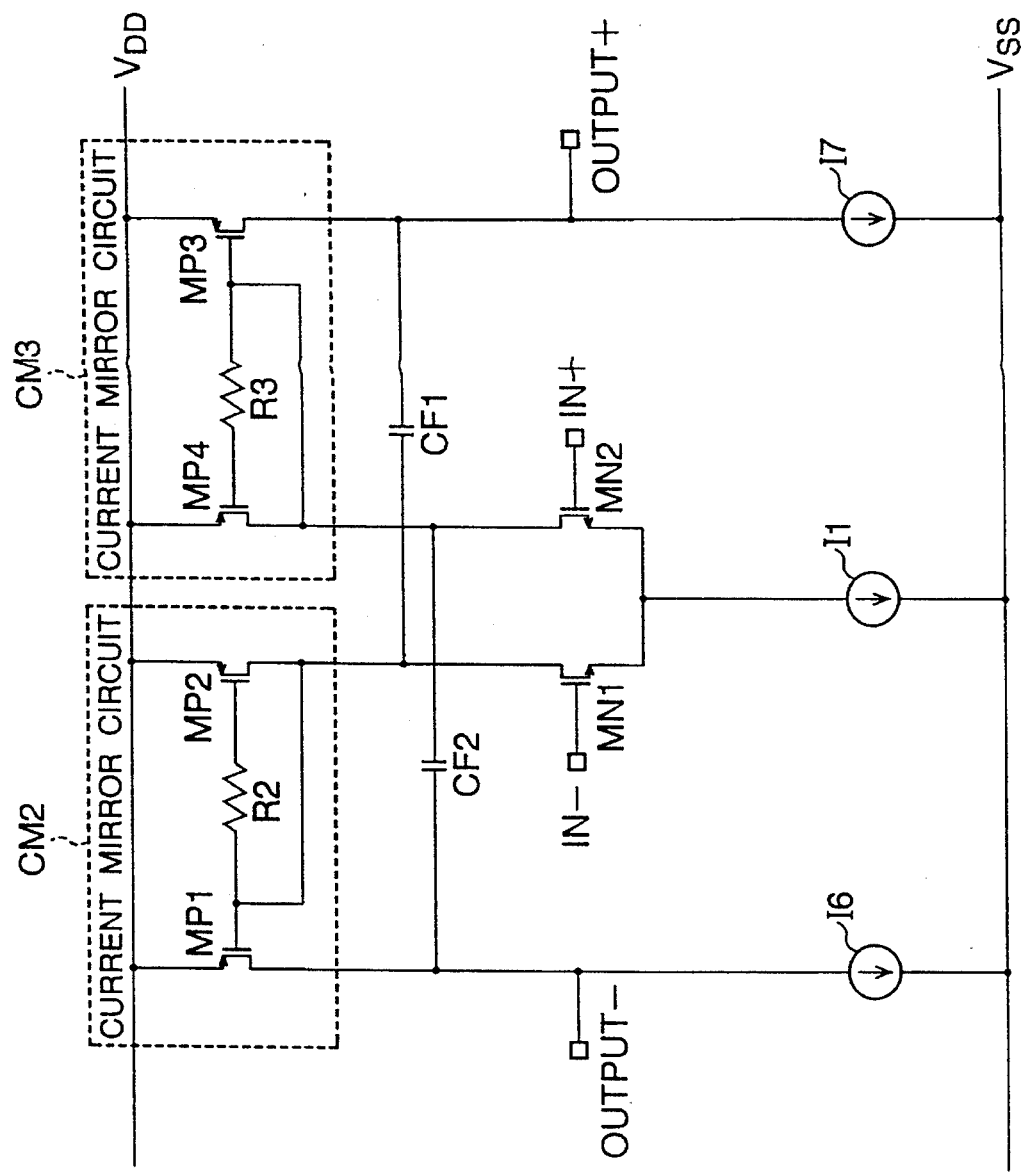
F I G. 1 8

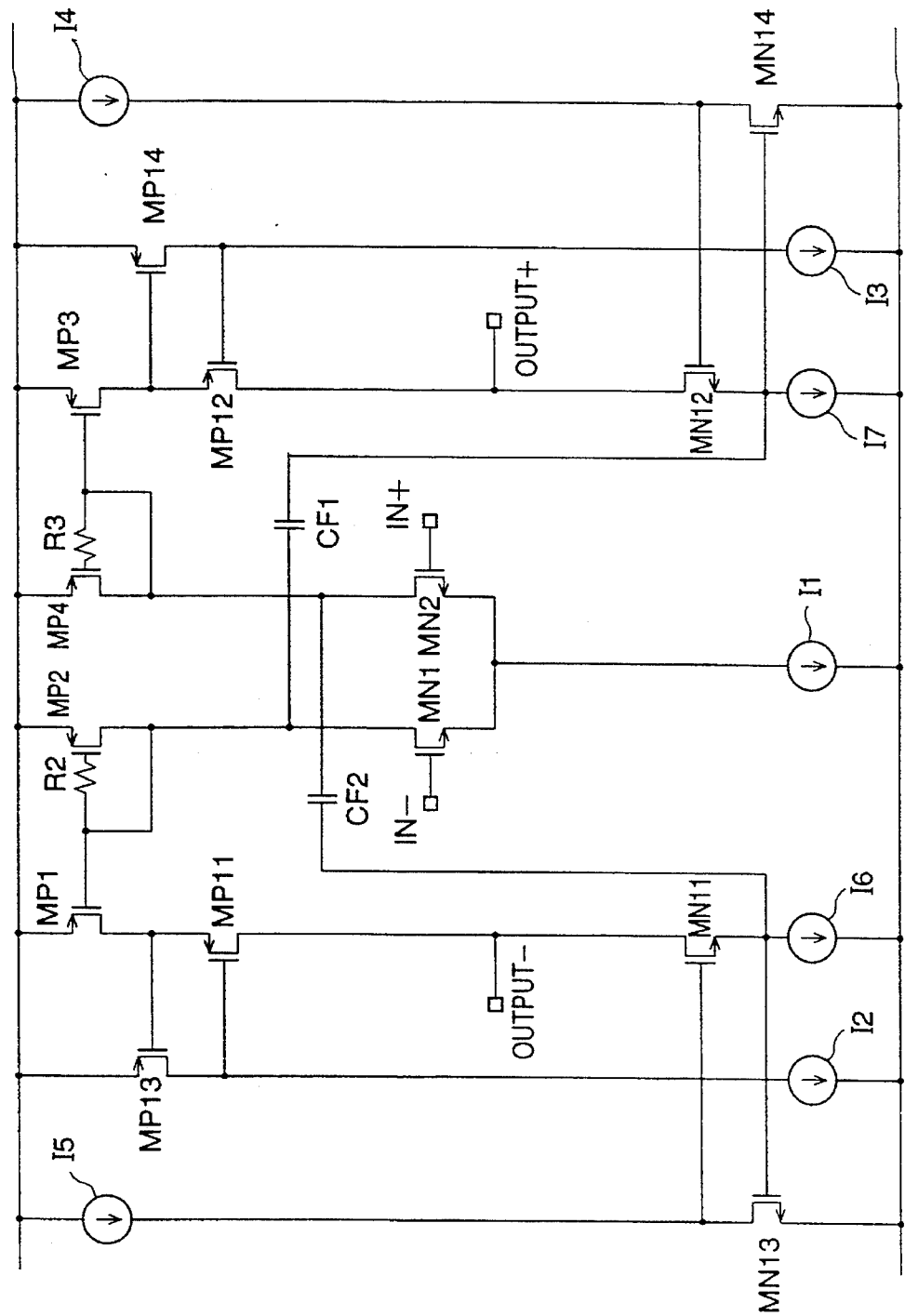
F I G. 19

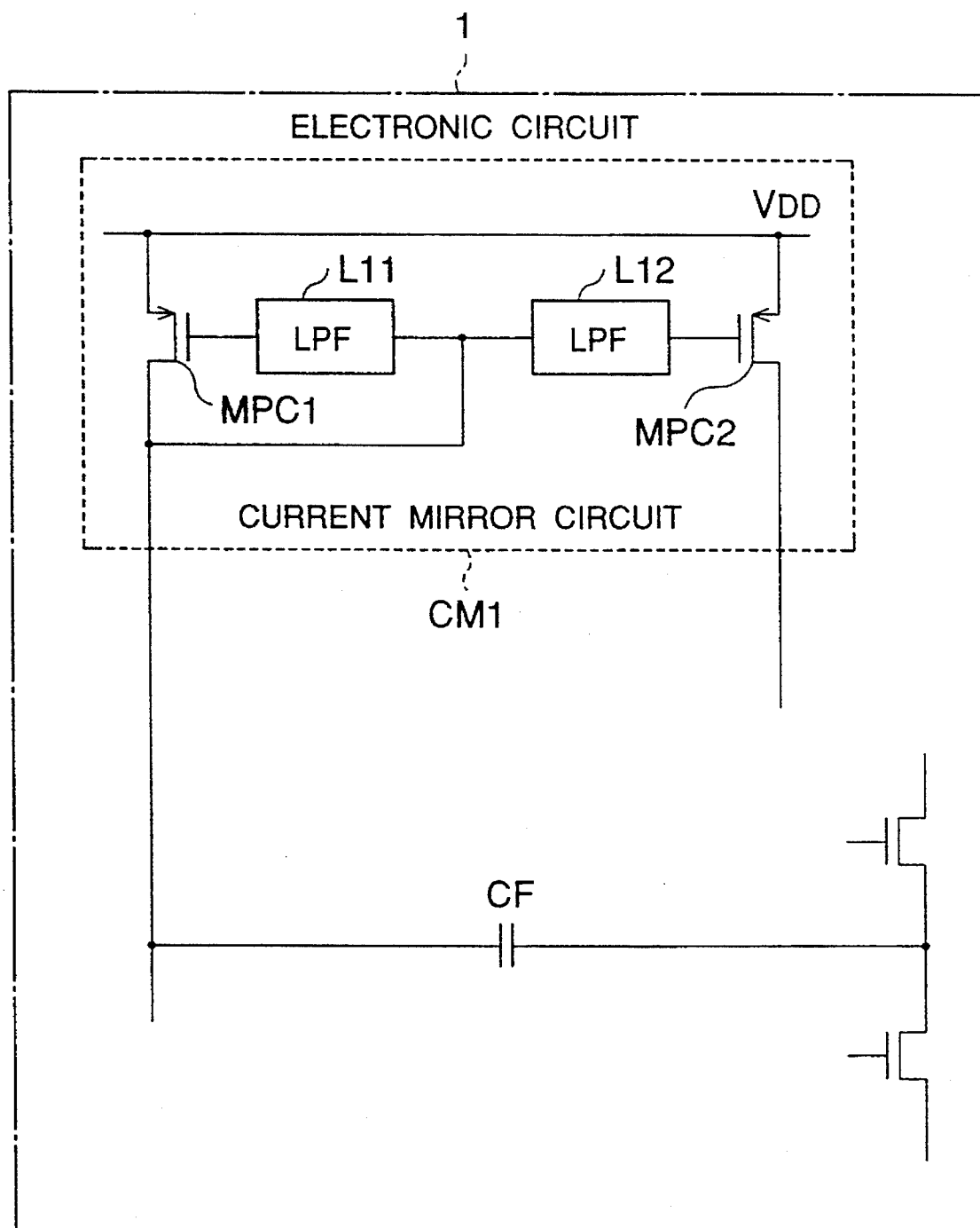
F I G. 2 1

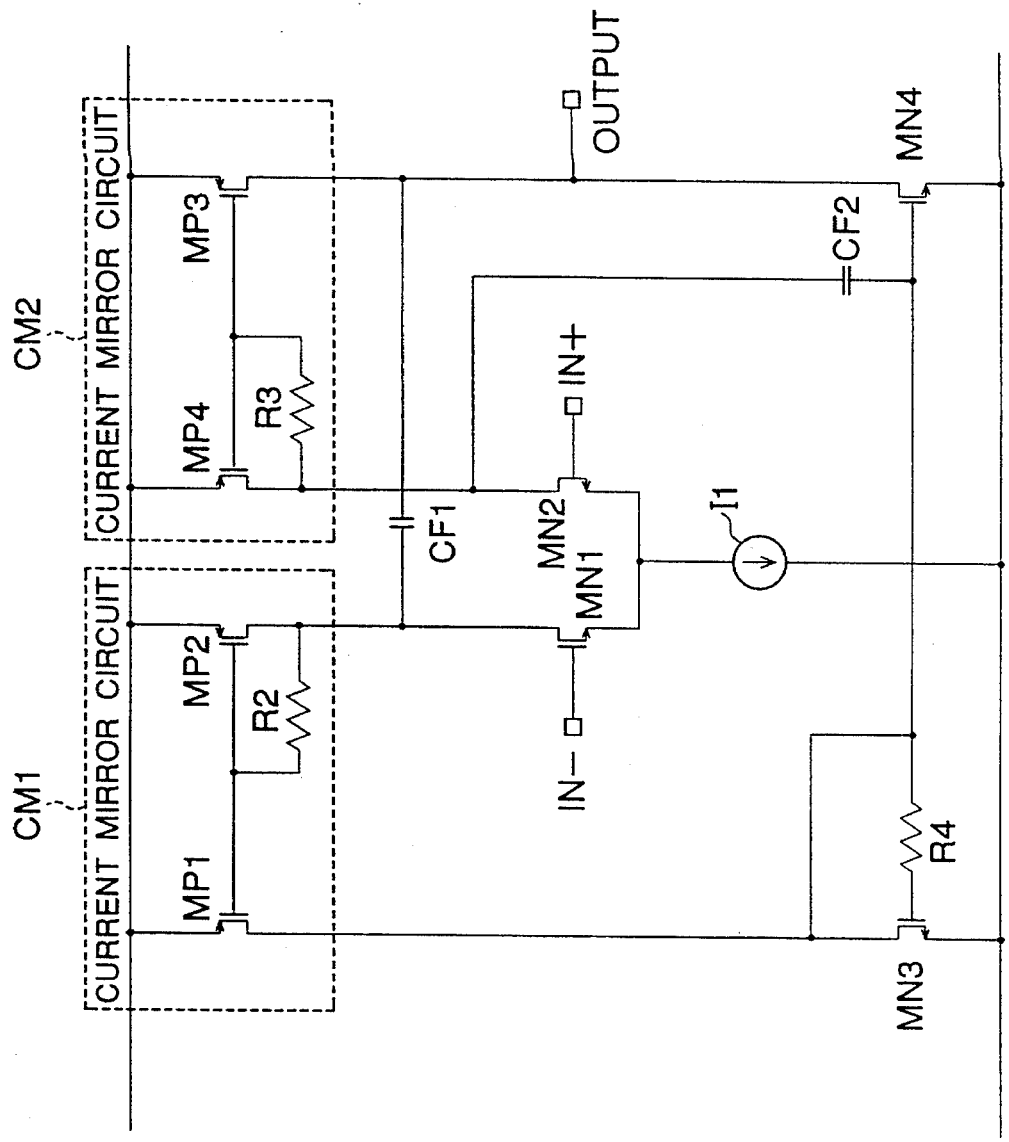
F I G. 2 6

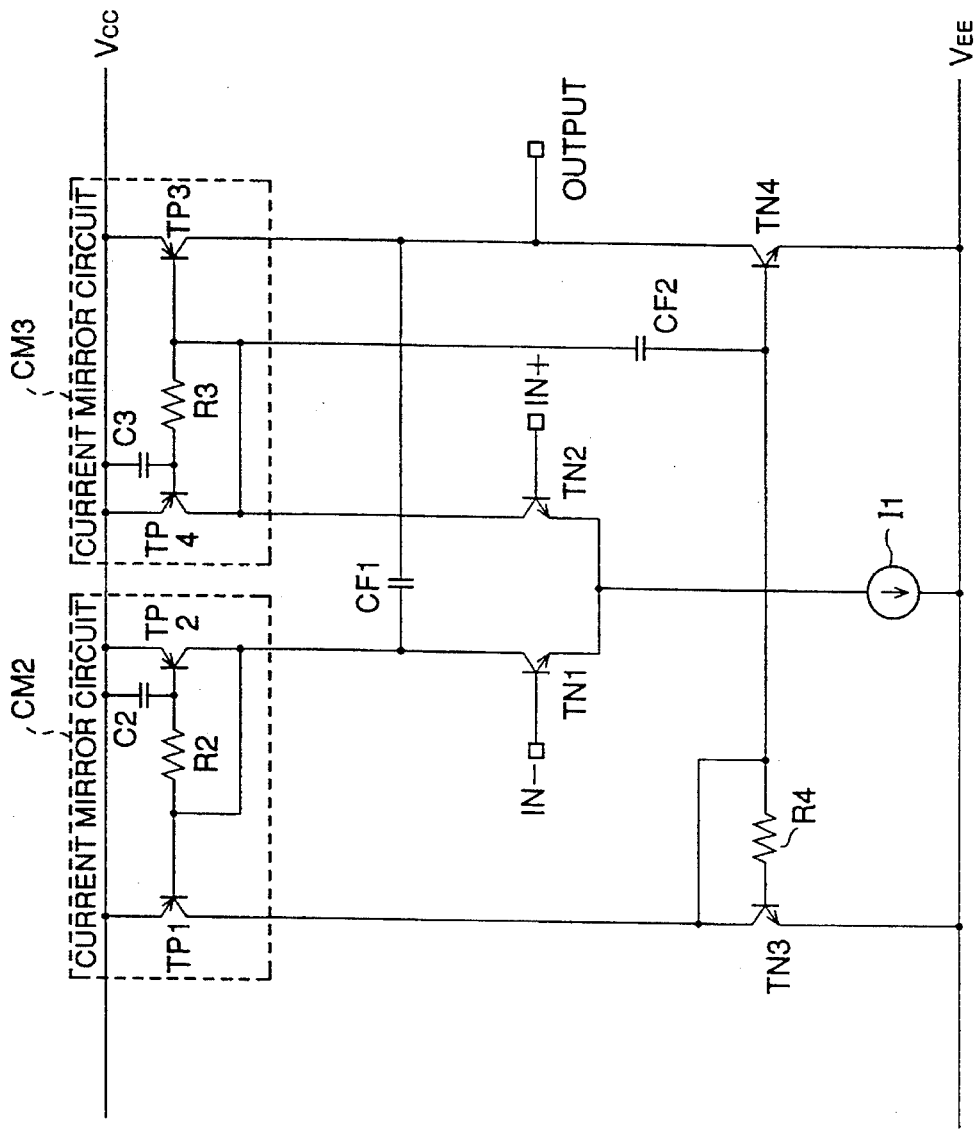
F I G. 27

ELECTRONIC CIRCUIT INCLUDING MEANS FOR REFLECTING SIGNAL CURRENT AND FEED FORWARD MEANS FOR COMPENSATING OPERATIONAL SPEED THEREOF

BACKGROUND OF THE INVENTION

The present invention relates to electronic circuits including signal current reflecting means such as current mirror circuits, reflection cascode circuits and the like, and more specifically to an electronic circuit including feedforward means for compensating operational speed of the signal current reflecting means. A multiplier is suggested as an example of the electronic circuit including the signal current reflecting means.

As shown in FIG. 1, a conventional multiplier comprises a first differential pair including N-channel metal oxide semiconductor (MOS) field effect transistors (FET) mn1 and mn2 both having gates to receive a first power source voltage $V_{IN1}$, a second differential pair including N-channel MOS FET mn3 and mn4 both having gates to receive a second power source voltage $V_{IN2}$, and a third differential pair including N-channel MOS FET mn5 and mn6 both having gates to receive the second power source voltage $V_{IN2}$, which are connected with one another by a cascade connection and in which first and second current outputs $I_{OUT1}$ and $I_{OUT2}$ are conducted from drains of the N-channel MOS FET mn3–mn6 constituting the second and third differential pairs, respectively.

In such the configuration, since it is impossible to realize a low power source voltage, a multiplier shown in FIG. 2 is conventionally proposed. The multiplier comprises four current mirror circuits in addition to three differential pairs shown in FIG. 1. A first current mirror circuit CM1 includes P-channel MOS FET mp1 and mp3, a second current mirror circuit CM2 includes P-channel MOS FET mp2 and mp4, a third current mirror circuit CM3 includes N-channel MOS FET mn3 and mn5, and a fourth current mirror circuit includes N-channel MOS FET mn4 and mn6. IN this manner, even though it is possible to realize the low power source voltage because the multiplier comprises the first through the fourth current mirror circuits CM1–CM4, a provision of four current mirror circuits makes the multiplier increase several numbers of nodes, thereby resulting a problem that a parasitic capacitance occurring in these nodes causes a signal bandwidth capable of processing to be narrow.

The current mirror circuits are generally used as means for reflecting a signal current in the conventional analog integrated circuits (IC). These are circuits in which, when base or gate electrodes and emitter or source electrodes in a plurality of transistors are commonly connected with one another in the case where sizes of the transistors are the same as one another, it is possible to cause a current to flow by having a predetermined value similar to an external current which is supplied to the transistors in the manner of being mirrored to the transistors on the output side.

However, in the case where the current mirror circuit is configured by using a P-channel MOS FET and a pnp transistor, since element operation speed of the P-MOS FET and the pnp transistors is limited, an operation frequency is also limited with respect to the electronic circuit including the current mirror circuits.

On the other hand, as disclosed in FIG. 2(b) of "A CMOS WIDEBAND AMPLIFIER WITH 800 MHz GAIN-BANDWIDTH", Proceedings, IEEE 1991 Custom Integrated Circuits Conference, there is suggested a method of providing a feedforward signal path by a capacitance in addition to a reflection cascode circuit except the current mirror circuit.

In this conventional example, a low frequency signal current is passing through a gate grounded circuit configured of a resistance and a P-MOS FET, while a high frequency signal current is passing through a feedforward signal path including a capacitance and a gate grounded circuit configured of an N-MOS FET, thereby improving entire high-frequency characteristics because of avoiding the P-MOS FET having a wrong high-frequency characteristic.

However, the conventional method has a problem that the circuit becomes a large scale and a complicated design because it is necessary to independently provide a circuit for generating a bias voltage to a gate or base in the gate- or base- grounded transistor constituting the reflection cascode circuit.

Accordingly, it is necessary to independently provide a gate grounded circuit and a bias circuit thereof in order to improve an operational speed in a high-frequency region in the conventional method using the reflection cascode circuit.

SUMMARY OF THE INVENTION

In view of the above-mentioned condition, an object of the present invention is to provide an electronic circuit having better high-frequency characteristics by including current mirror circuits each having a small circuit scale.

In order to achieve the above object, an electronic circuit according to the present invention and including signal current reflection means having an input portion and an output portion, comprises voltage-current conversion means for generating an output current in proportion with an input current; the signal current reflection means including the input portion having an input terminal for receiving the output current from the voltage-current conversion means and the output portion for outputting the current after reflection, and including low frequency signal passing means provided between a control electrode of a transistor constituting the input portion and a control electrode of a transistor constituting the output portion and for passing through a low frequency signal component occurring in the control electrodes of the transistors; and feedforward means provided between the input terminal of the input portion of the signal current reflection means and an output stage of the electronic circuit and for causing a high frequency signal component supplied to the signal current reflection means to flow into the output stage.

It is required that the electronic circuit comprises a low pass filter for limiting a bandwidth of a control signal which is supplied to a gate or base of at least a transistor through which an input current flows in a current mirror circuit as the signal current reflection means, and a feedforward signal path provided by a capacitance between an input terminal of the current mirror circuit and other terminal of the electronic circuit including the current mirror circuit.

As configured in the above construction, even though the current mirror circuit has a low input impedance with respect to the low frequency signal component because the low pass filter which is provided at the gate of the transistor in which the input current flows in the current mirror circuit supplies the control signal in which the high frequency signal component is limited, the electronic circuit including the current mirror has a high input impedance because the current mirror circuit operates as a constant current source with respect to the high frequency signal component.

At this time, since the feedforward signal path is provided by a capacitance between an input of the current mirror circuit and other terminal of the electronic circuit, the signal is transmitted through the current mirror circuit in the low frequency, while the signal is transmitted through the feedforward signal path in the high frequency. Accordingly, since the signal of the high frequency is transmitted without passing through the current mirror circuit, it is impossible to improve the characteristics of the signal in the high frequency.

As described above, since the input impedance in the current mirror circuit becomes larger in accordance with the frequency being higher, the high frequency signal component of the input current is fed forward to the output or the node near the output through the capacitance constituting the feedforward signal path. Since the signal in the high frequency can be transmitted by bypassing the current mirror circuit which is configured of a P-MOS FET, it is possible to prevent the deterioration of the performance caused by a gain in the current mirror circuit which is configured by the P-MOS FET. Furthermore, since it is unnecessary to provide a gate grounded circuit and a bias circuit therewith, the circuit scale can be reduced.

BRIEF DESCRIPTION OF THE DRAWINGS

In the accompanying drawings:

FIG. 4 is a block diagram showing an electronic circuit including current mirror circuits according to a first embodiment of the present invention;

FIG. 5 is a circuit diagram showing an electronic circuit according to a second embodiment when the present invention is applied in an amplifier circuit;

FIG. 6 is a circuit diagram showing an electronic circuit according to a third embodiment as a modified example of the second embodiment shown in FIG. 5;

FIG. 10 is a circuit diagram showing an electronic circuit according to a sixth embodiment of the present invention in which a feedforward signal path is changed by connecting a resistance in series to a source of a transistor constituting a current mirror circuit;

FIG. 11 is a circuit diagram showing an electronic circuit according to a seventh embodiment of the present invention in which the resistor connected in series to the source in the sixth embodiment is realized by an ON resistance of a MOS transistor;

FIG. 14 is a circuit diagram showing an electronic circuit according to a tenth embodiment in which the present invention is applied to an amplifier circuit including a cascode type current mirror circuit;

FIG. 18 is a circuit diagram showing an electronic circuit according to a twelfth embodiment of the present invention in which the feedforward signal path of the eleventh embodiment is modified;

FIG. 18 is a circuit diagram showing an electronic circuit according to a fourteenth embodiment in which a low pass filter is concretely configure of a resistance and a gate capacitance of a transistor in the thirteenth embodiment;

FIG. 19 is a circuit diagram showing an electronic circuit according to a fifteenth embodiment in which the present invention is applied to an amplifier circuit having differential outputs;

FIG. 21 is a block diagram showing an electronic circuit according to a seventeenth embodiment of the present invention;

FIG. 26 is a circuit diagram showing an electronic circuit according to a twenty-second embodiment in which a low pass filter of the twenty-first embodiment is concretely configured of a resistor and a gate capacitance of a transistor;

FIG. 27 is a circuit diagram showing an electronic circuit according to a twenty-third embodiment in which a circuit shown in FIG. 7 is realized by bipolar transistors;

DETAILED DESCRIPTION OF THE PREFERRED EMBODIMENTS

There will be described in detail an electronic circuit including signal current reflection means according to preferred embodiments of the present invention in reference with the attached drawings.

Figure 3:
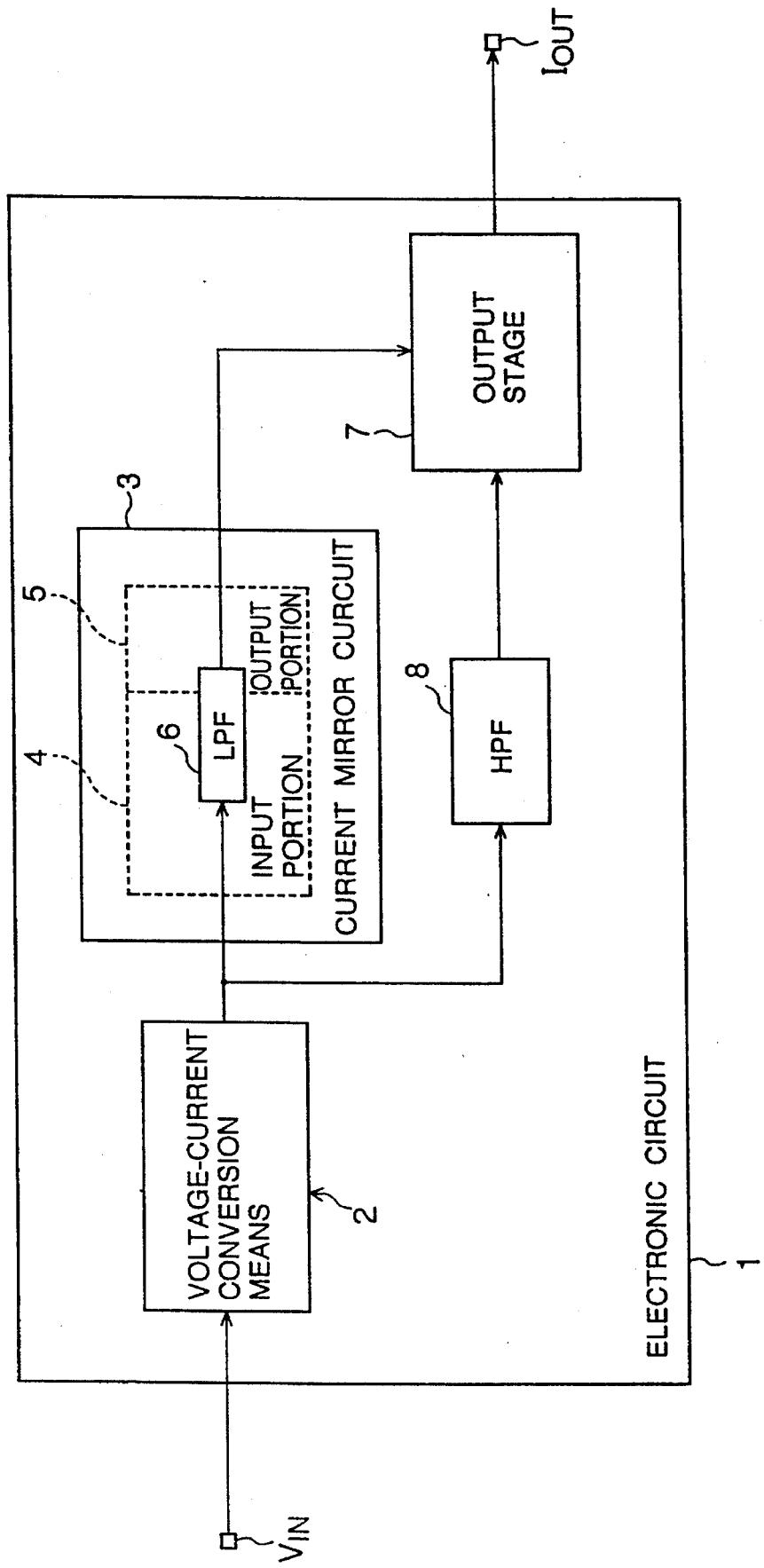
FIG. 3 is a block diagram showing a basic concept of an electronic circuit including signal current reflection means according to the present invention.

Before embodiments are described, there is described a basic concept of the present invention in accordance with FIG. 3. In FIG. 3, a voltage which is supplied in an electronic circuit 1 through an power source voltage input terminal $V_{IN}$, is converted into a current by voltage-current conversion means 2 in the electronic circuit 1, and the current is supplied to a current mirror circuit 3 as signal current reflection means. The current mirror circuit 3 comprises an input portion 4 and an output portion 5 which are comprised of transistors, respectively, and a low frequency signal passing circuit (LPF—low pass filter) 6 is provided between a control (gate) electrode of a transistor in the input portion 4 and a control (gate) electrode of a transistor in the output portion 5. A high frequency signal passing circuit (HPF—high pass filter) 8 is provided between an input terminal of the input portion 4 and an output stage 7. Accordingly, there is a feedforward signal path from the voltage-current conversion means 2 through the HPF 8 to the output stage 7 in addition to a main signal path from the voltage-current conversion means 2 through the current mirror circuit 3 to the output stage 7.

There will be described respective embodiments in detail.

At first, a first embodiment of the present invention is described on the basis of the drawings. FIG. 4 is a block diagram showing an electronic circuit including current mirror circuits according to a first embodiment to which the present invention is applied.

A current mirror circuit CM1 in an electronic circuit 1 is comprised of transistors MPC1 and MPC2 and a low pass filter L1. In the current mirror circuit CM1, a drain of the transistor MPC1 to which an input current flows is connected to a gate of the transistor MPC2 and to a gate of the transistor MPC1 through the low pass filter L1.

Little low frequency signal component inputted in the current mirror circuit is flowing in the feedforward signal path because an impedance of a capacitance $C_F$ forming the feedforward signal path is high in a low frequency. Furthermore, since a drain voltage of the transistor MPC1 is transmitted to the gate of the transistor MPC1 through the low pass filter L1 in the low frequency signal region, there is operation of the general current mirror circuit, thereby reflecting the input current by the transistor MPC2.

On the contrary, since the drain voltage of the transistor MPC 1 in the high frequency signal region is interrupted by the low pass filter L1, the drain voltage is not transmitted to the gate of the transistor MPC 1, and the transistor MPC1 operates as a current source in the high frequency signal region, thereby increasing an input impedance of the current mirror circuit. Therefore, since an impedance of the capacitance $C_F$ forming the feedforward signal path is low in the high frequency signal region, the high frequency component supplied to the current mirror circuit is flowing into the feedforward signal path, and the high frequency component is transmitted by bypassing the current mirror circuit, thereby improving the high frequency signal characteristics of the electronic circuit 1. Furthermore, it is possible to miniaturize the circuit size because it is unnecessary to provide a gate grounded circuit and a bias circuit therewith, in comparison with the case where the conventional reflection cascode is used.

FIG. 5 shows an electronic circuit according to a second embodiment of the present invention which applies to an amplifier circuit. In FIG. 5, transistors MN1 and MN2 constitutes a differential pair having respective gates which are connected to positive and negative input terminals IN+ and IN−, respectively. A current source I1 supplies a current to the differential pair. Differential input signals are supplied through the positive and negative input terminals IN+ and IN−. In the low frequency region, output currents of the differential pair are reflected at current mirror circuits CM2 and CM3, respectively, and a current is further reflected at the current mirror circuit CM2 is reflected by the general current mirror circuit constituted of the transistors MN3 and MN4 to output through an output terminal OUTPUT with a current which is reflected by the current mirror circuit CM3.

In the current mirror circuits CM2 and CM3, since a bandwidth of a control voltage which is supplied to gates of the transistors MP2 and MP4 is limited, an input impedance of the current mirror circuits CM2 and CM3 becomes high in the high frequency region, thereby causing the high frequency signal component of the output current of the differential pair to be fed forward through capacitance $C_{F1}$ and $C_{F2}$ constituting the feedforward signal path to the output or nodes near the output. In this manner, since the signal can be transmitted by bypassing the current mirror circuit constructed by the P-MOS FET in the high frequency region, it is possible to prevent the deterioration of the performance such as the gain in the current mirror circuit constituted by the P-MOS FET. Furthermore, since it is unnecessary to provide the gate grounded circuit and the bias circuit therewith, the circuit scale and size can be miniaturized.

In a current mirror circuit configured by transistors MN3 and MN4 as shown in FIG. 6, a control voltage is supplied through the low pass filter L4 to a gate of the transistor MN3 to increase an impedance of a node at the end of the feedforward signal path caused by a capacitance $C_{F2}$ with the frequency increasing, thereby adding a peaking in the high frequency signal.

Figure 7:
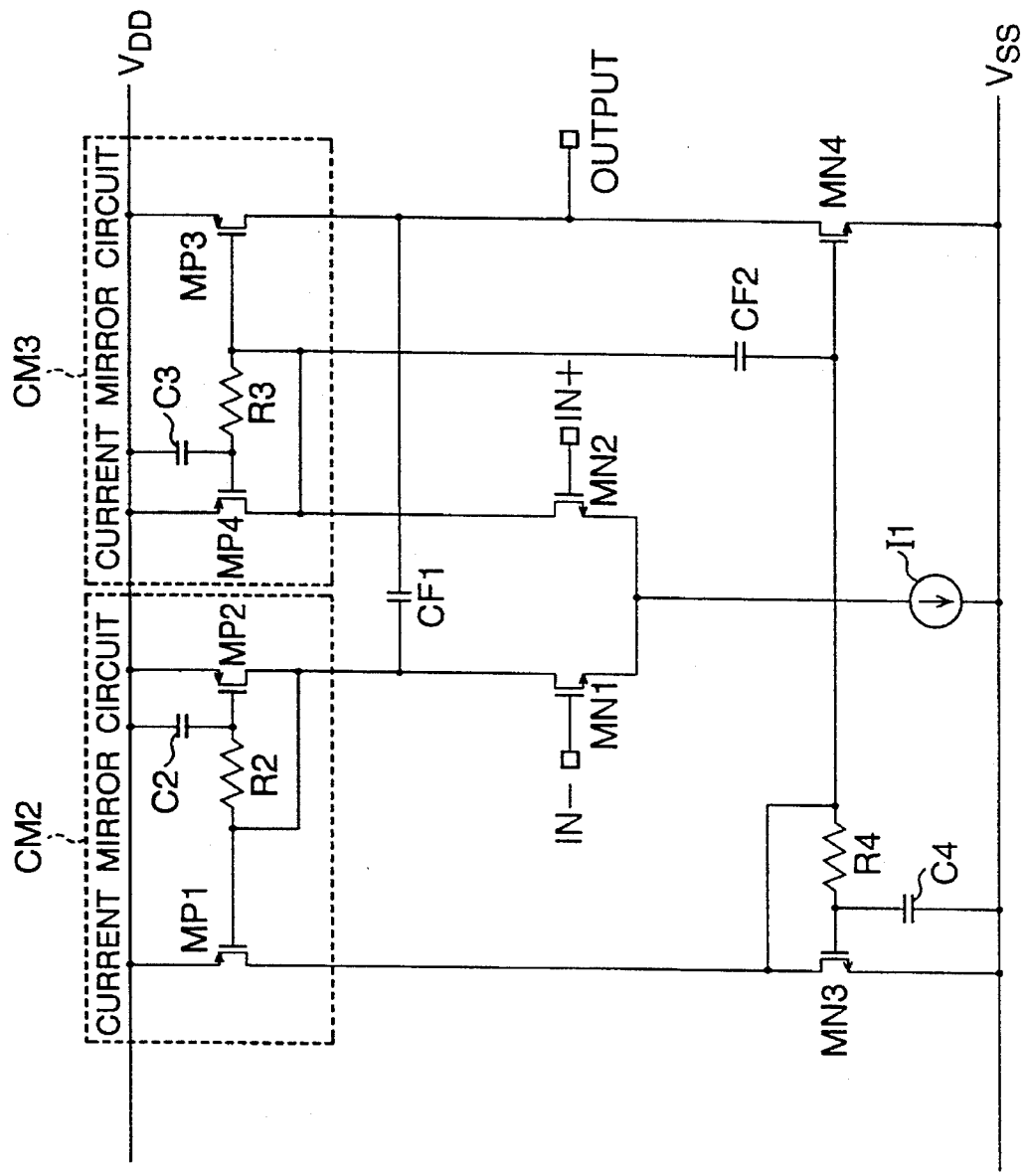
FIG. 7 is a circuit diagram showing an electronic circuit according to a fourth embodiment in which a low pass filter in the third embodiment is concretely configured by a resistance and capacitance.
Figure 8:
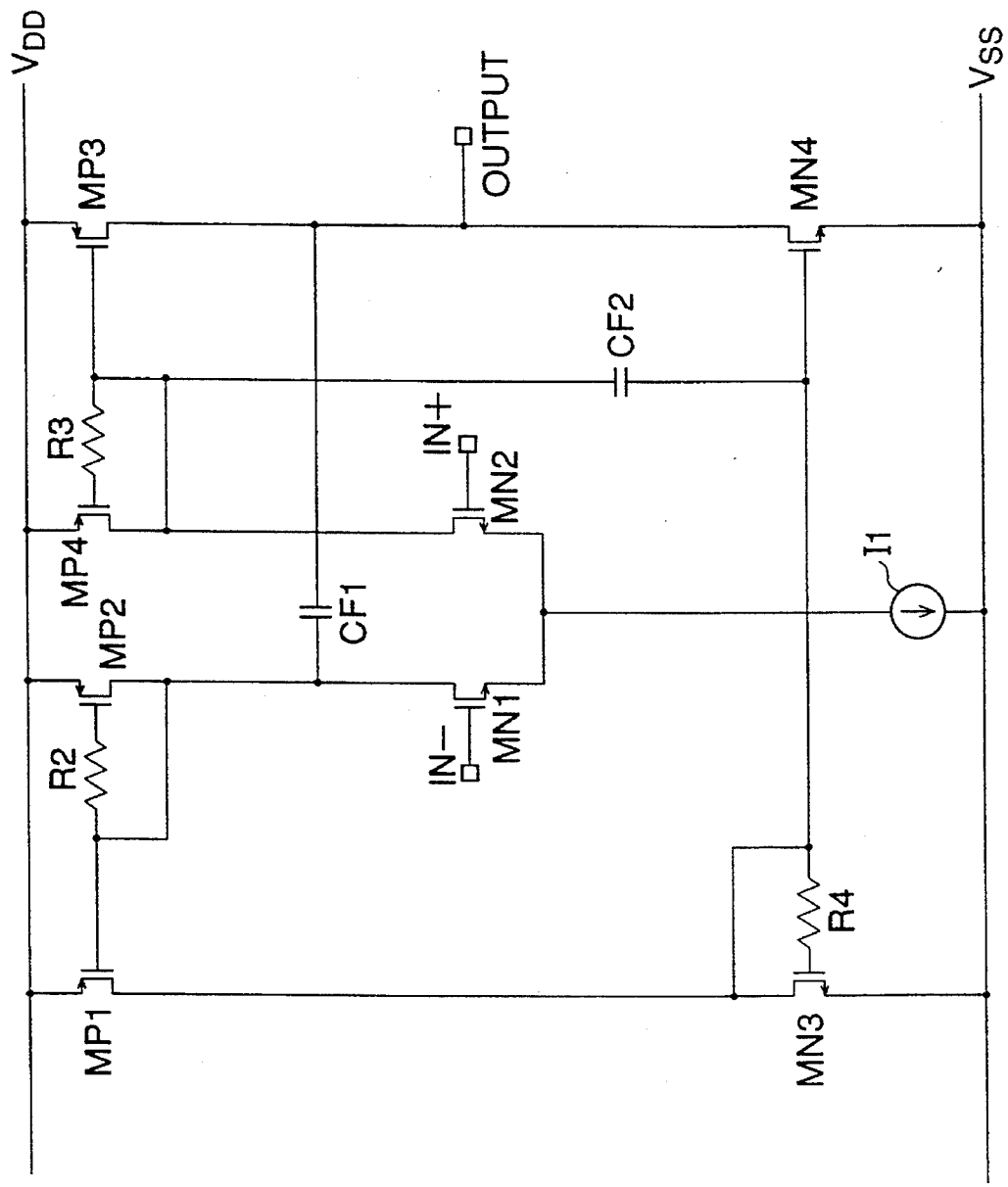
FIG. 8 is a circuit diagram showing an electronic circuit according to a fifth embodiment in which a capacitance constituting a low pass filter in the fourth embodiment is realized by a gate capacitance of a transistor.
Figure 9:
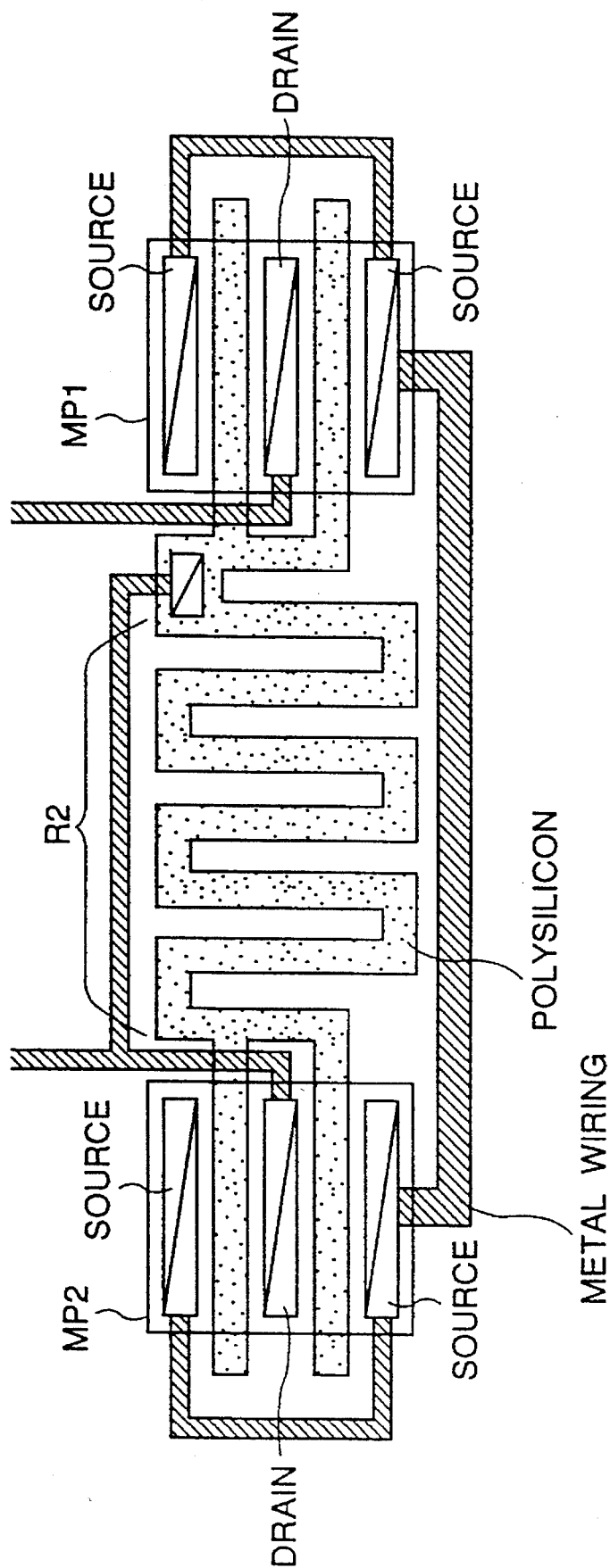
FIG. 9 is a sectional view showing an electronic circuit according to a modified example of the fifth embodiment for realizing a resistance constituting the low pass filter of the fourth embodiment by a polysilicon constituting a gate of the transistor.

The low pass filter L2 through L4 in FIG. 6 can easily realize by resistors R2–R4 and capacitors C2–C4 as shown in FIG. 7. Furthermore, the low pass filters L2–L4 may be configured by a gate capacitance of transistors MP2, MP4 and MN3 and resistors R2–R4 as shown in FIG. 8. At this time, as shown in FIG. 9, in the current mirror circuit CM2 for example, a polysilicon constituting a gate of the transistor MP2 may be extended to form the resistor R2.

FIG. 10 resistors RS1–RS6 are respectively connected in series to sources of the transistors MP1–MP4, MN3 and MN4 constituting the current mirror circuits in order to increase an output impedance of the current mirror circuits shown in FIG. 8. At this time, as shown in FIG. 10, the end of the feedforward by the capacitance $C_{F1}$ is the source of the transistor MN4.

Figure 12:
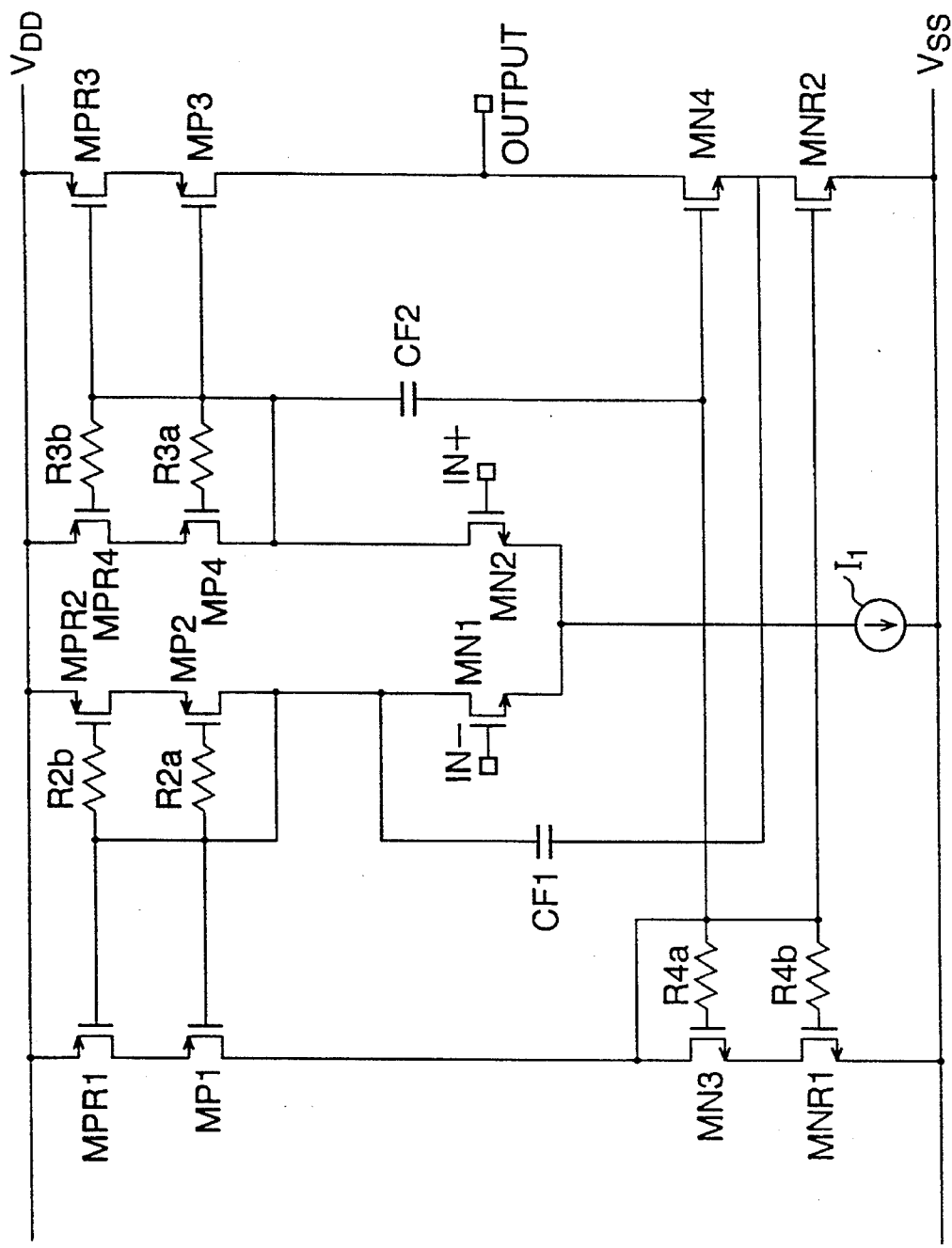
FIG. 12 is a circuit diagram showing an electronic circuit according to a eighth embodiment as a modified example of the seventh embodiment.

FIG. 11 shows an example in which the resistors RS1–RS6 are realized by the transistors MPR1–MPR4, MNR1 and MNR2, and this example can decrease a necessary area for realizing the resistors RS1–RS6 in the case of making an integrated circuit (IC). In FIG. 11, even though gates of the transistors MPR2, MPR4 and MNR1 are common to gates of the transistors MP2, MP4 and MN3, the gates of the transistors MPR2, MP4 and MN3 may be connected through the resistors R2b–R4b to drains of the MP2, MP4 and MN3 as shown in FIG. 12.

Figure 13:
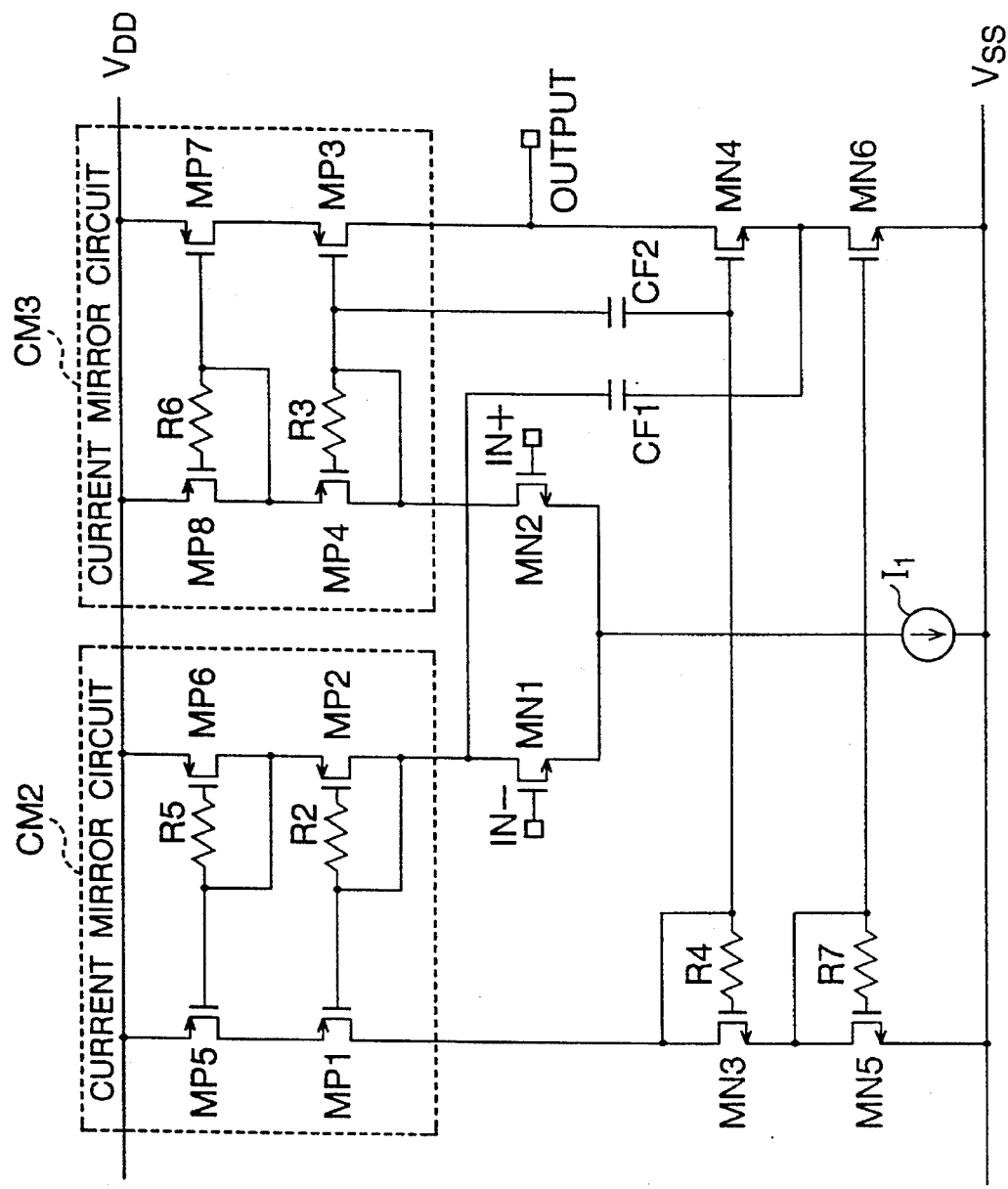
FIG. 13 is a circuit diagram showing an electronic circuit according to a ninth embodiment in which the present invention is applied to an amplifier circuit including a cascode type current mirror circuit.

FIG. 13 shows a modified embodiment in which the current mirror circuit shown in FIG. 8 may be changed by a cascode configuration in order to increase an output impedance, and resistors R2–R7 constituting the low pass filters with gate capacitance of the transistors are connected in series to the gates of the transistors MP2, MP4, MP6, MP8, MN3 and MN5 in which an input current of the current mirror circuit flows. In FIG. 13, the end of the feedforward signal path including a capacitance $C_{F1}$ is a source of the transistor MN4 as the same as the circuit shown in FIG. 9, thereby resulting the same effect of the circuit shown in FIG. 9.

FIG. 14 shows a modified embodiment which uses current mirror circuits having another cascode configuration to the circuit shown in FIG. 8, and resistors R2–R4 each constituting the low pass filters with gate capacitance of the transistors are connected in series to gates of the transistors MP2, MP4 and MN3 in which an input current of the current mirror circuit flows. In FIG. 14, the end of the feedforward signal path including a capacitance $C_{F1}$ is a source of the transistor MN4 as the same as the circuit shown in FIG. 9, thereby resulting the same effect of the circuit shown in FIG. 9.

Figure 15:
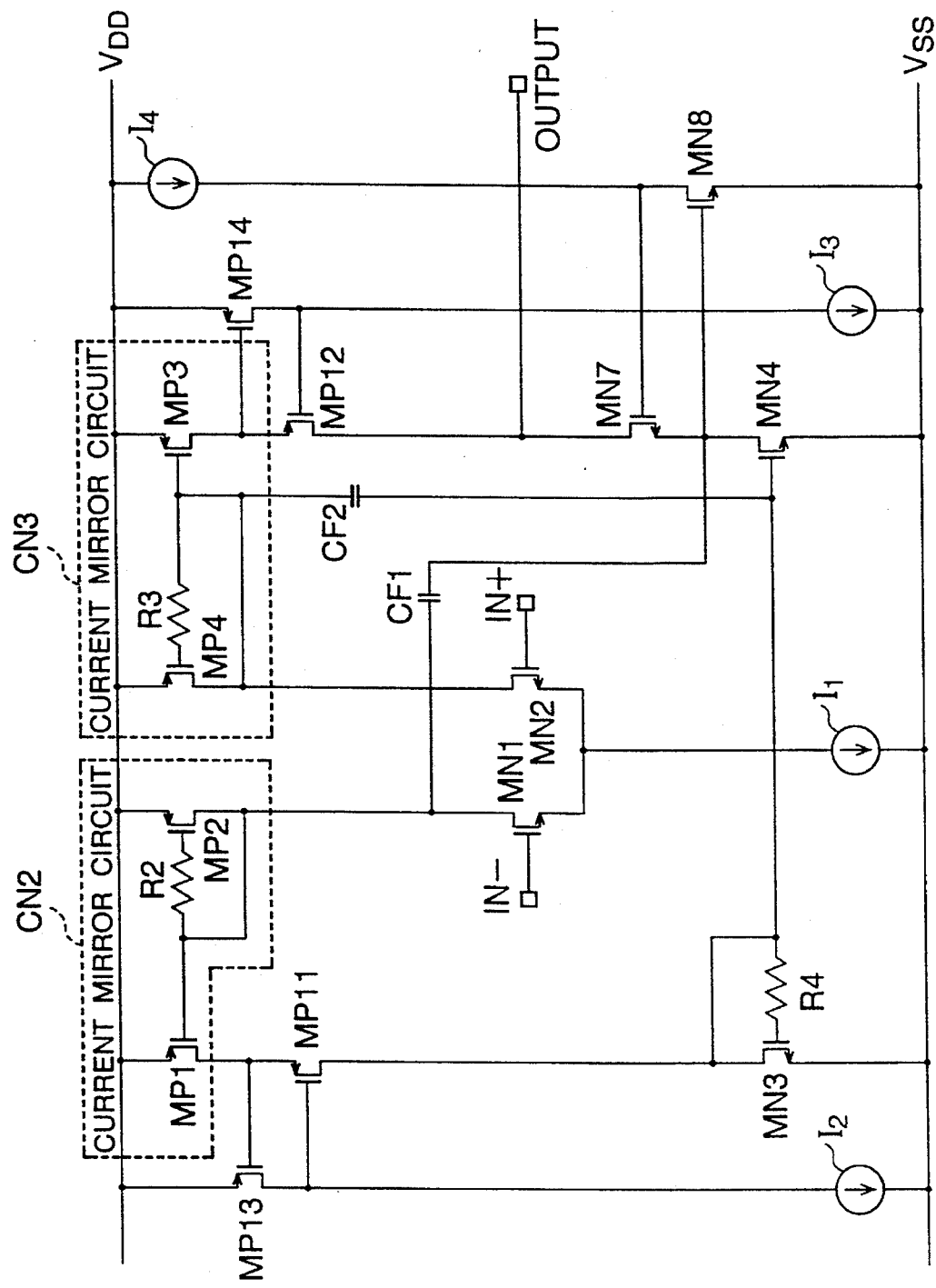
FIG. 15 is a circuit diagram showing an electronic circuit according to an eleventh embodiment in which the present invention is applied to an amplifier circuit.

FIG. 15 shows an example using a regulated cascode circuit disclosed in "A High-Swing, High-Impedance MOS Cascode Circuit", IEEE Journal of Solid-State Circuit, vol. 25, Feb. 1990, in order to increase an output impedance of the current mirror circuit shown in FIG. 8. The transistor MP11 and MP13 and current source I2 increase the output impedance of the current mirror circuit CM2, and the transistors MP12 and MP14 and current source I3 increase the output impedance of the current mirror circuit CM3. Furthermore, the transistors MN7 and MN8 and current source I4 increase the output impedance of the current mirror circuit which is configured by the transistors MN3 and MN4 and resistor R4. In FIG. 15, the end of the feedforward signal path including a capacitance $C_{F1}$ is a source of the transistor MN7, thereby resulting the same effect of the circuit mentioned above.

FIG. 16 shows a modified embodiment in which the end of the feedforward signal path including the capacitance $C_{F2}$ is a gate of transistor MN7. Since the high frequency component fed forward through the capacitance $C_{F2}$ and the high frequency component fed forward through the capacitance $C_{F1}$ are outputted to the output terminal OUTPUT only through the transistor MN7, both of the passing time of the high frequency components to the output terminal OUTPUT are substantially the same as each other, thereby improving phase characteristics in the high frequency region in comparison with an example shown in FIG. 12.

The present invention may apply to an amplifier circuit for outputting the differential output. For example, in FIG. 17, transistors MN1 and MN2 constitute a differential pair, and each of gates thereof is connected to positive and negative input terminals IN+ and IN–. A differential input signal is supplied through the positive and negative input terminals IN+ and IN–. A current source I1 supplies a current to the differential pair. In low frequency signal region, an output current of the differential pair is reflected by the current mirror circuits CM2 and CM3 to output through the output terminals OUTPUT+ and OUTPUT– by using the current source I6 and I7 as a load.

Figure 17:
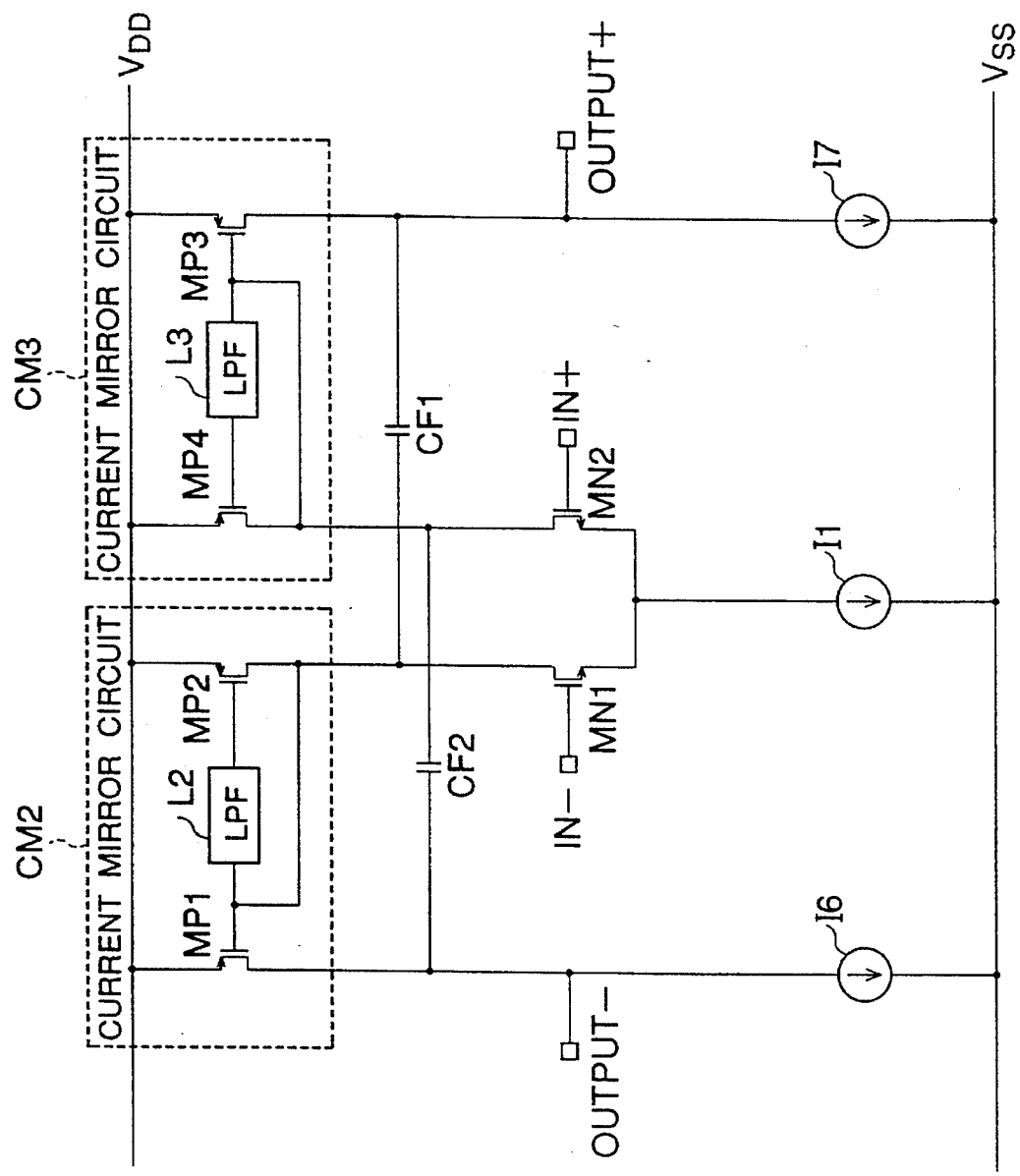
FIG. 17 is a circuit diagram showing an electronic circuit according to a thirteenth embodiment in which the present invention is applied to an amplifier circuit having differential outputs.
Figure 20:
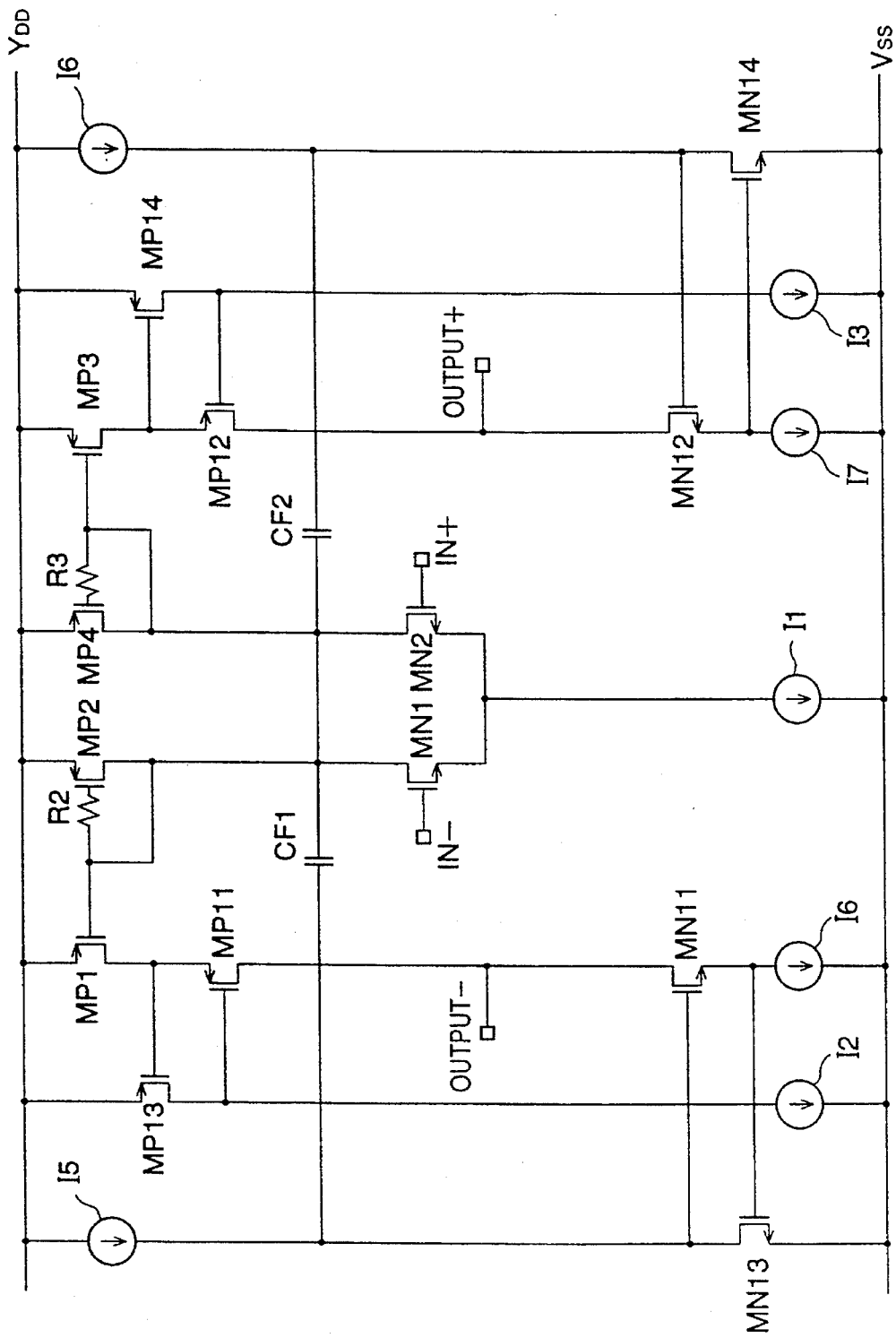
FIG. 20 is a circuit diagram showing an electronic circuit according to a sixteenth embodiment in which the feedforward signal path of the fifteenth embodiment is modified.

FIG. 18 shows an electronic circuit according to an embodiment in which the low pass filter L2 shown in FIG. 17 is configured by a resistor R2 and a gate capacitance of a transistor MP2, and the low pass filter L3 shown in FIG. 17 is configured by a resistor R3 and a gate capacitance of a transistor MP4.

FIG. 19 shows an embodiment in which a regulated cascode circuit is applied to the circuit shown in FIG. 18, and the ends of the feedforward respectively including the capacitance $C_{F1}$ and $C_{F2}$ are sources of the transistors MN12 and MN11, respectively. Furthermore, the ends of the feedforward may be gates of the transistors MN11 and MN12.

Even though there are described several embodiments in which the low pass filter limits a bandwidth of only signal supplied to the gate of the transistor in which an input current of the current mirror flows, as shown by a seventeenth embodiment in FIG. 21, a low pass filter L12 also limits a bandwidth of th signal supplied to the gate of the transistor MPC2 in which an output current of the current mirror circuit CM1 flows, thereby reducing an influence of the gate capacitance of the transistor MPC2 in which an output current of the current mirror circuit flows at the input terminal of the current mirror circuit.

Figure 22:
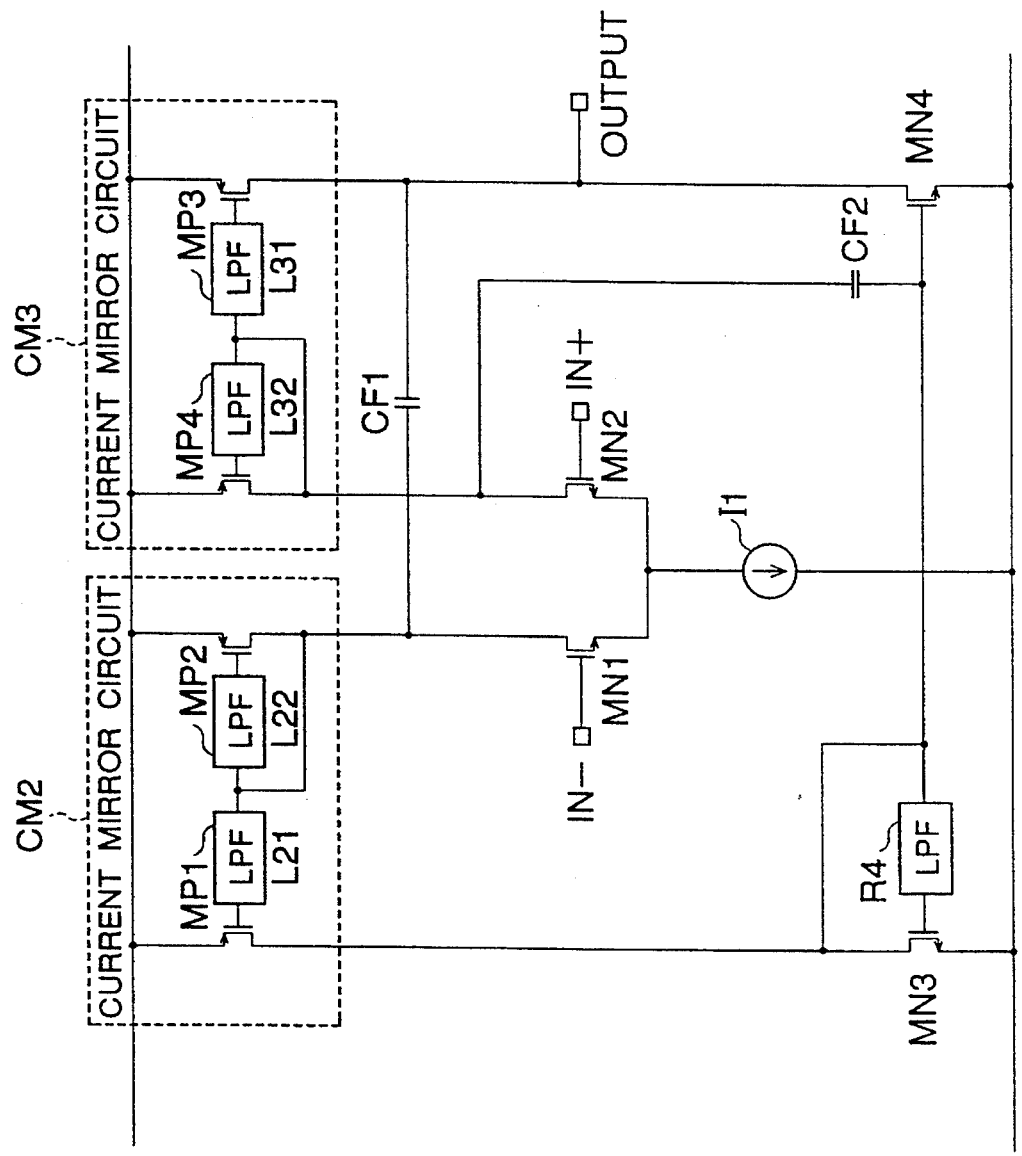
FIG. 22 is a circuit diagram showing an electronic circuit according to an eighteenth embodiment in which the present invention is applied to an amplifier circuit.

FIG. 22 shows an eighteenth embodiment in which the present invention is applied to an amplifier circuit. In FIG. 22, transistors MN1 and MN2 constitute a differential pair, and each of the gates are connected to positive and negative input terminals IN+ and IN–, respectively. The differential input signal is supplied through the input terminals IN+ and IN–. The current source I1 supplies a current to the differential pair. In the low frequency signal region, an output current of the differential is reflected by the current mirror circuits CM2 and CM3, and the current reflected by the current mirror circuit CM2 is further reflected by the current mirror circuit which is configured by the transistors MN3 and MN4 and the low pass filter L4 so as to output through the output terminal OUTPUT⁻ with the current which is reflected by the current mirror circuit CM3.

In the current mirror circuits CM2 and CM3, since a bandwidth of the control signal supplied to the gates of the transistors MP2 and MP4 is limited in the low pass filter L22 and L32, a high frequency signal region has a high input impedance of the current mirror circuits CM2 and CM3. Furthermore, the low pass filters L21 and L31 can decrease a reduction of the impedance in the high frequency region caused by an influence of the gate capacitance of the transistors MP1 and MP3 in the input current of the current mirror circuits CM2 and CM3. Accordingly, a high frequency component of the output current of the differential pair is fed forward in a high efficiency through the feedforward signal path which is configured by the capacitance $C_{F1}$ and $C_{F2}$ to the output terminal or the node near the output. In this way, since the signal of a high frequency range can be transmitted by bypassing the current mirror circuit which is constituted from the P-MOS FET, it is possible to prevent a performance such as a gain in the current mirror circuit comprised of the P-MOS FET from a deterioration. Furthermore, since it is unnecessary to provide a gate grounded circuit, it can be also unnecessary to provide a bias circuit with the gate grounded circuit, thereby causing a circuit scale or size to be miniaturized.

Moreover, in FIG. 22, a control voltage is supplied through a low pass filter L4 to a gate of a transistor MN3, and the impedance of the node at the end of the feedforward signal path by the capacitance $C_{F2}$ becomes larger with becoming higher the frequency in the same manner of the current mirror circuits CM2 and CM3, thereby making a peaking to the high frequency component.

Figure 23:
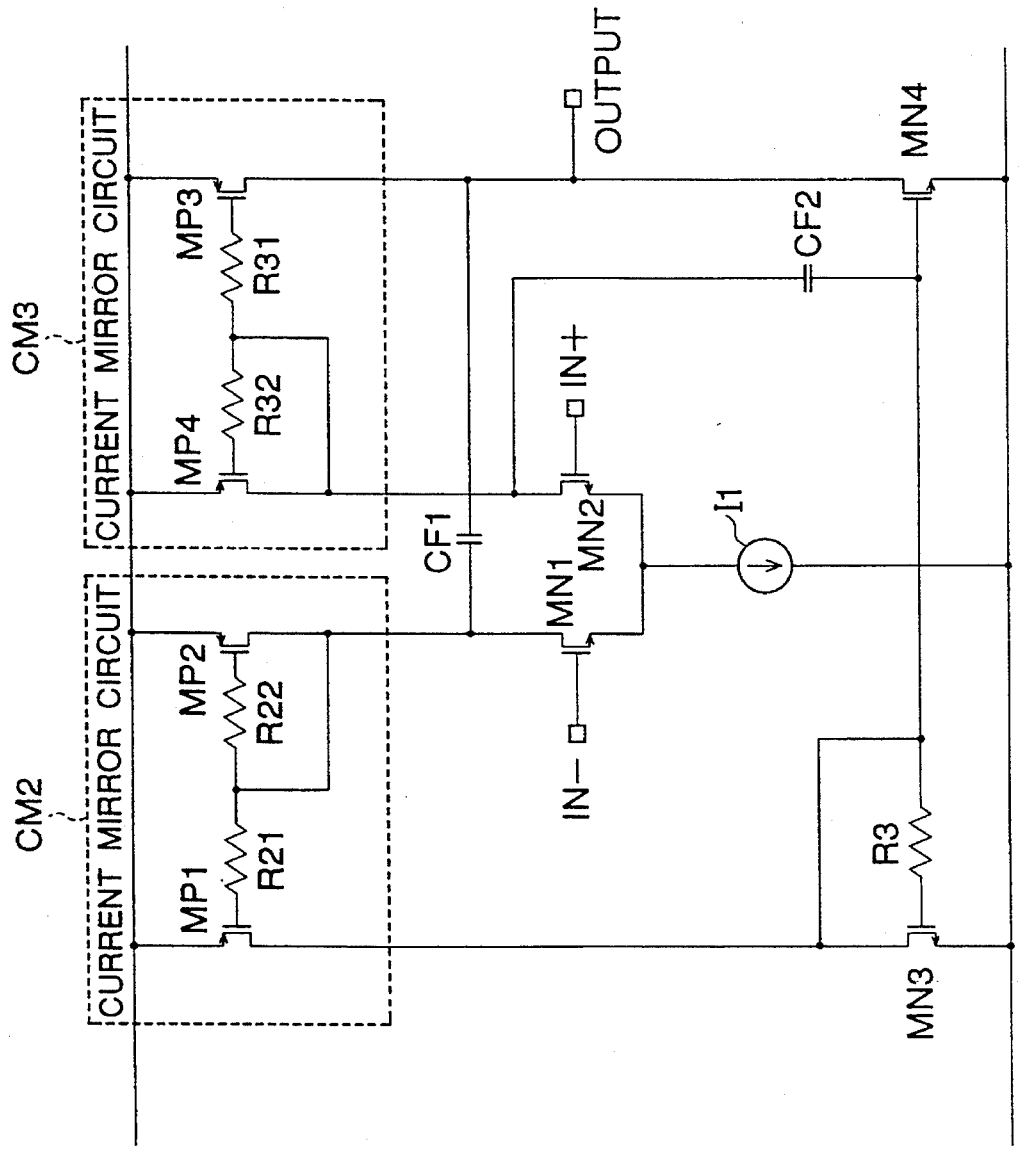
FIG. 23 is a circuit diagram showing an electronic circuit according to a nineteenth embodiment in a low pass filter of the eighteenth embodiment is concretely configured of a resistor and a gate capacitance of a transistor.

FIG. 23 shows an electronic circuit according to a nineteenth embodiment realizing the low pass filter shown in FIG. 22 by a gate capacitance of a transistor and a resistor.

Figure 24:
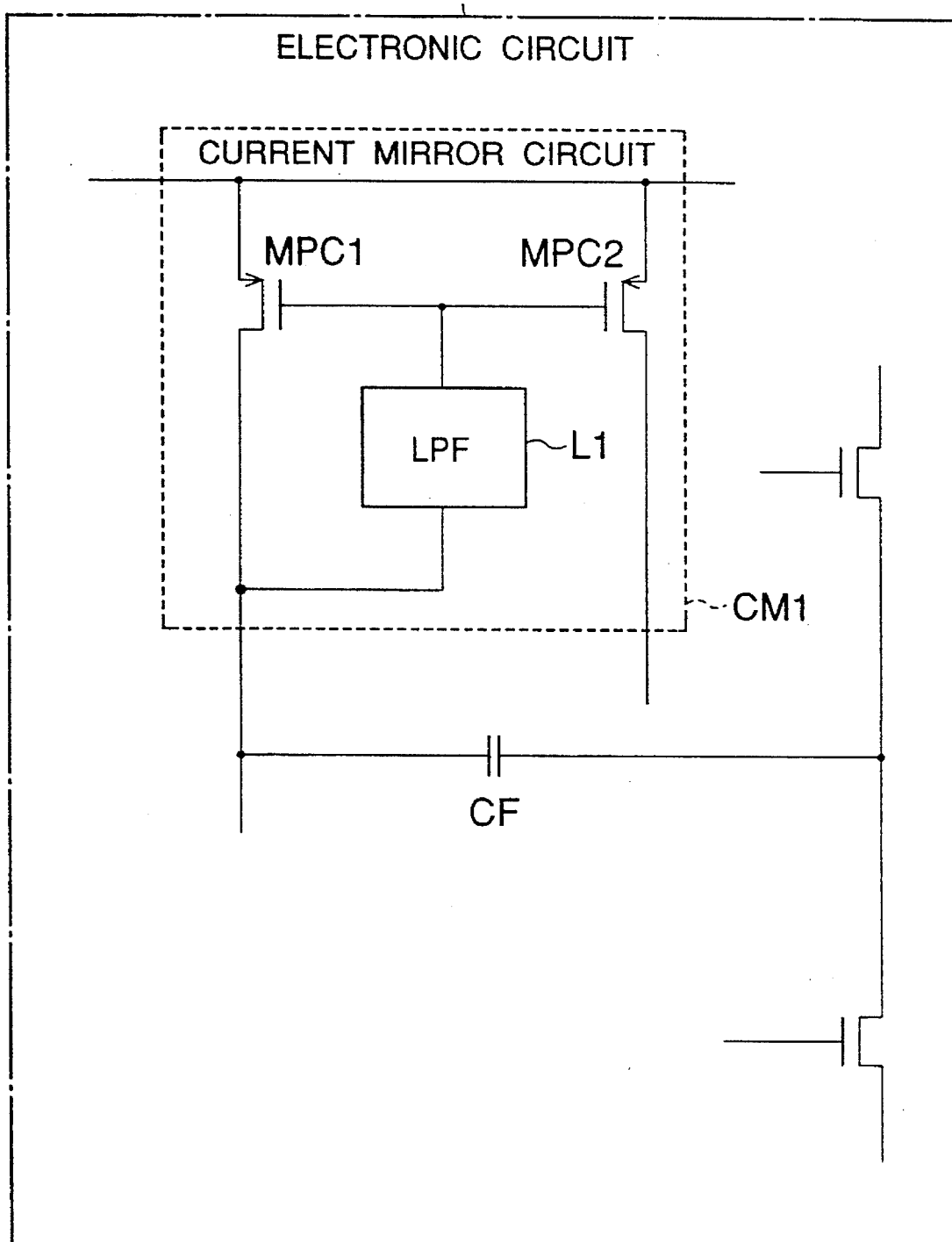
FIG. 24 is a block diagram showing an electronic circuit according to a twentieth embodiment of the present invention.
Figure 25:
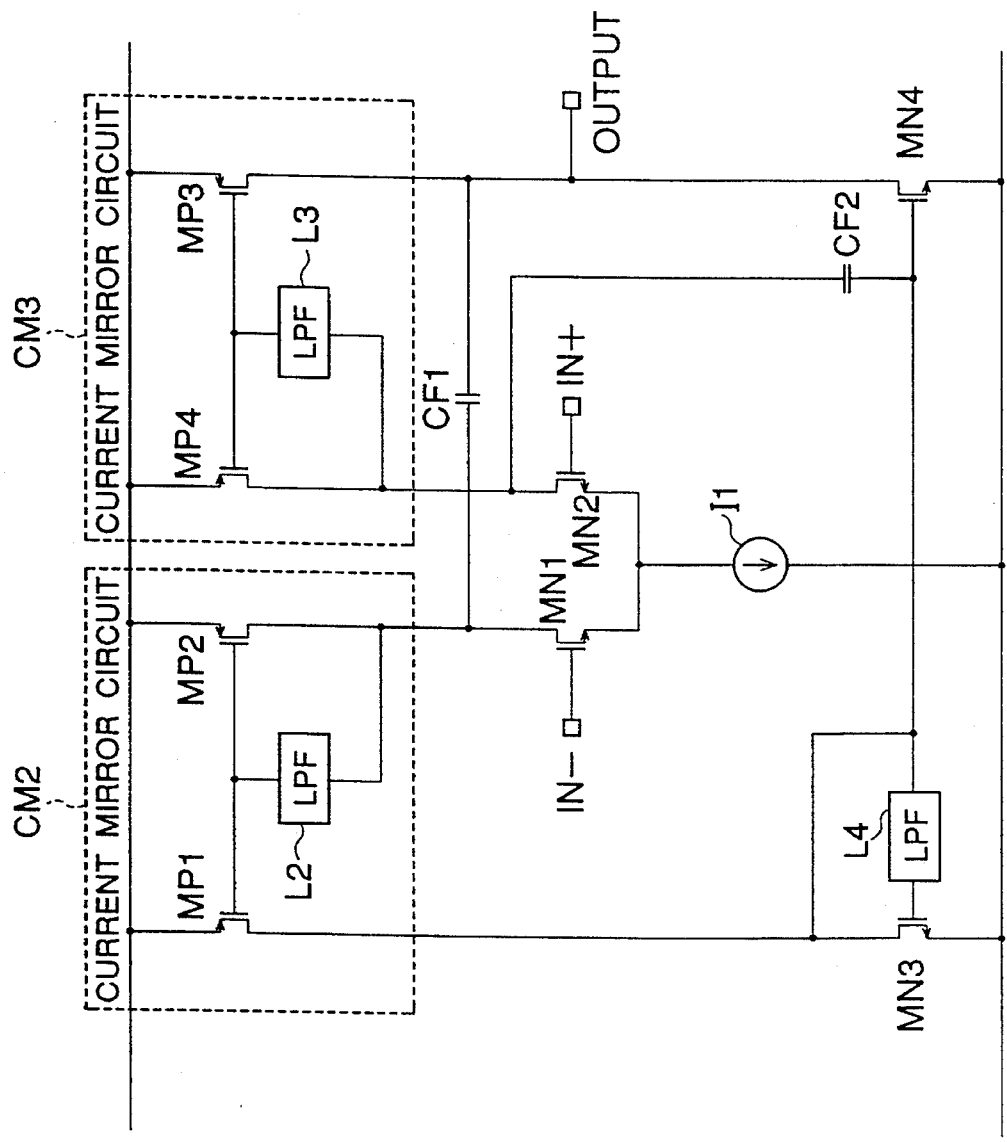
FIG. 25 is a circuit diagram showing an electronic circuit according to a twenty-first embodiment in which the present invention is applied to an amplifier circuit.

Even though the low pass filters of the seventeenth embodiment shown in FIG. 21 are separately provided for limiting a bandwidth of the signal which is supplied to a gate of the transistor constituting the current mirror circuit, it is possible to obtain the same effect as the seventeenth embodiment by commonly using one low pass filter such as a twentieth embodiment shown in FIG. 24. FIG. 25 shows an embodiment in which the present invention is applied to an amplifier circuit and FIG. 26 shows an embodiment in which the low pass filter shown in FIG. 25 is comprised of a gate capacitance of a transistor and resistor.

Even though there are described above several embodiments with respect to the electronic circuits which are constituted by MOS transistors, it is possible to apply the present invention to bipolar transistors. For example, it is possible to realize the circuit shown in FIG. 7 by replacing pnp transistors and npn transistors with P-MOS FET and N-MOS FET as shown in FIG. 27.

Figure 1:
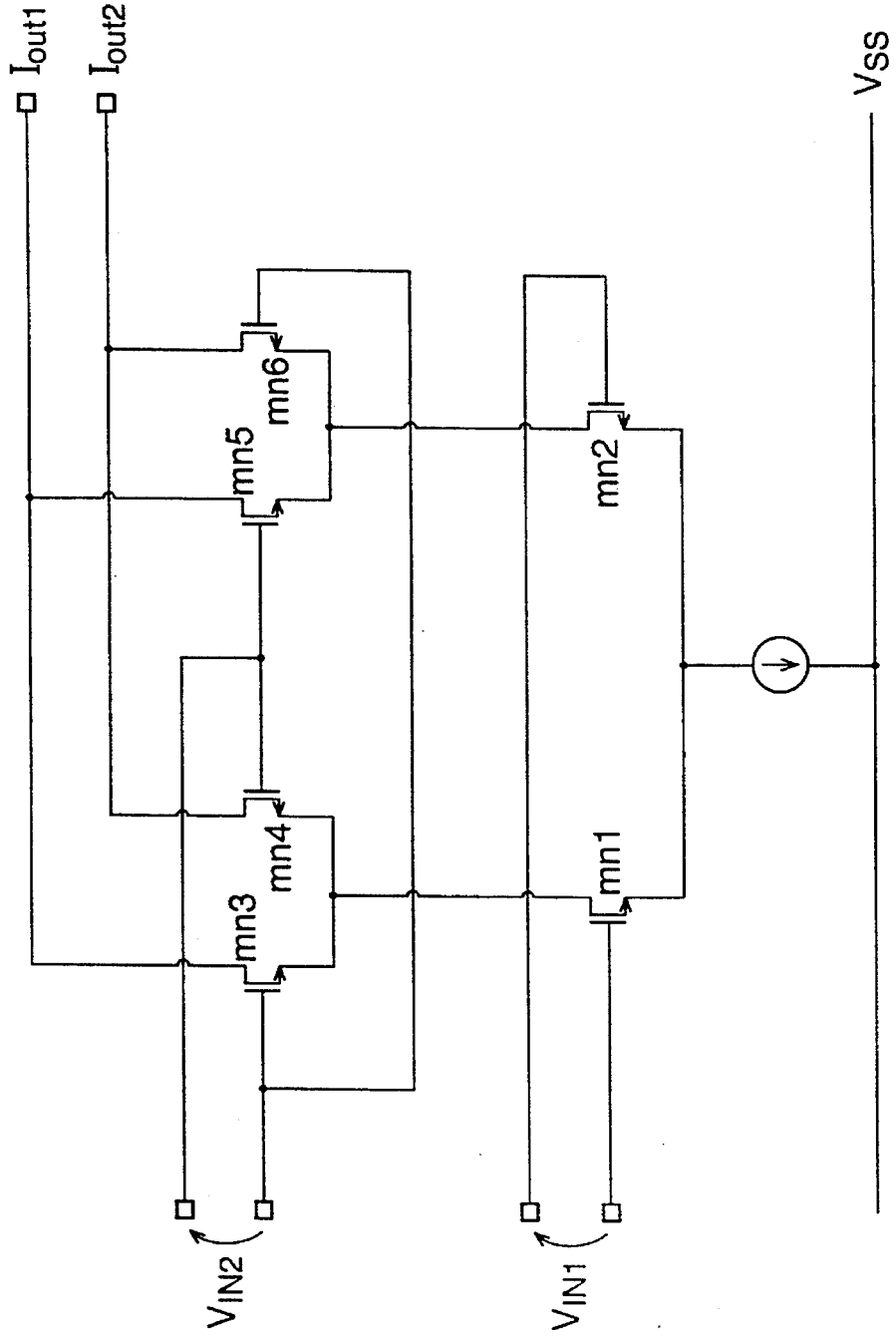
FIG. 1 is a circuit diagram showing an example of a conventional multiplier including differential pairs.
Figure 2:
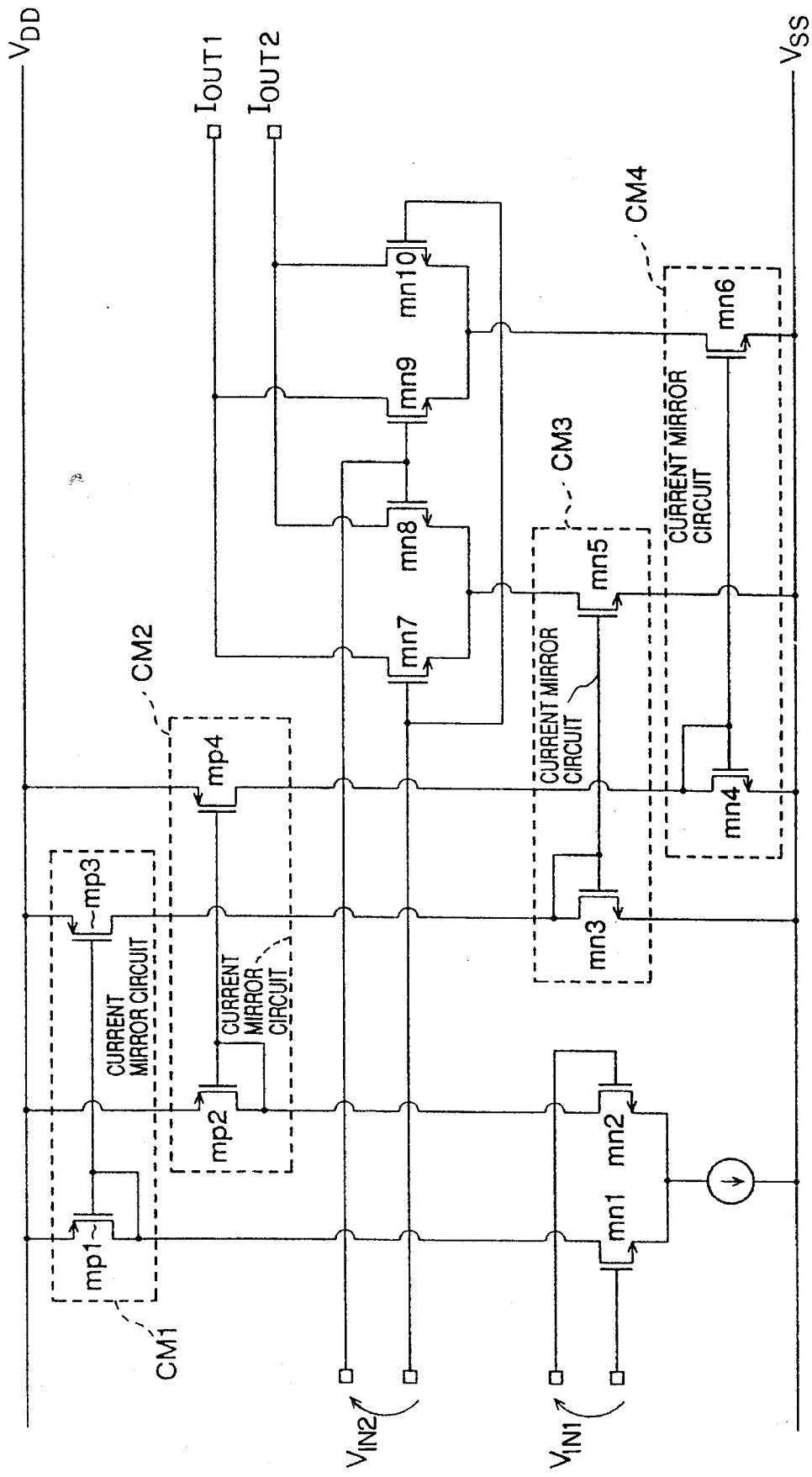
FIG. 2 is a circuit diagram showing another example of the conventional multiplier including a plurality of current mirror circuits.
Figure 28:
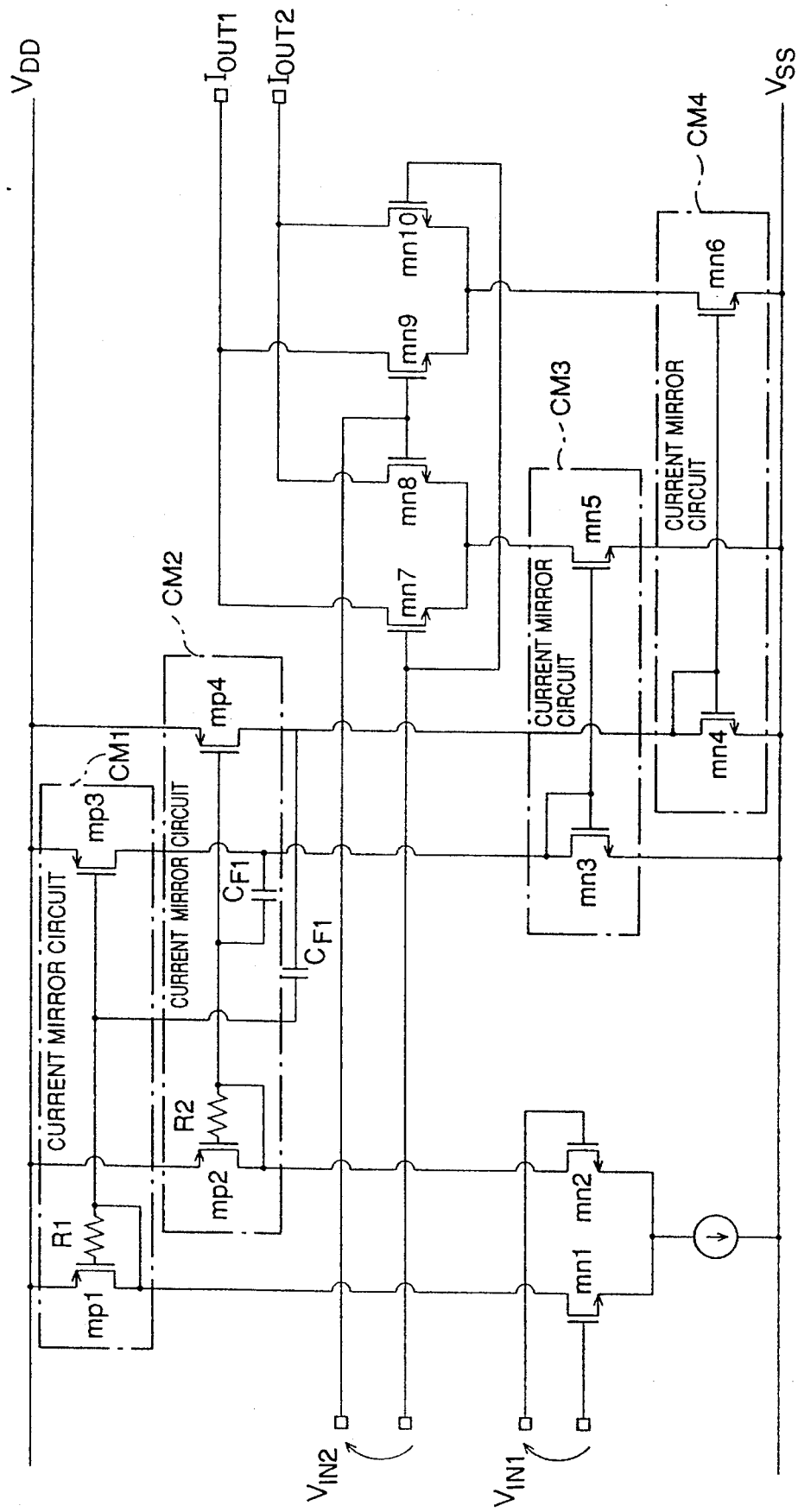
FIG. 28 is a circuit diagram showing an electronic circuit according to a twenty-fourth embodiment in which the present invention is applied to a multiplier.

FIG. 28 is a circuit diagram showing an electronic circuit including current mirror circuits according to a twenty-fourth embodiment in which the present invention is applied to a multiplier shown in FIG. 2. In FIG. 28, a resistor R1 is inserted into a gate of a P-channel MOS transistor mp1 constituting a first current mirror circuit CM1, and a resistor R2 is also inserted into a gate of a P-channel MOS transistor mp2 of a second current mirror circuit CM2. A feedforward capacitance $C_{F1}$ is provided between the gate of the P-MOS transistor mp2 and a drain of a P-MOS transistor mp3 of the first current mirror circuit CM1 for feeding forward a high frequency signal component, and a feedforward capacitance $C_{F2}$ is provided between the gate of the P-MOS transistor mp1 and a drain of a P-MOS transistor mp4 of the second current mirror circuit CM2 for feeding forward a high frequency signal component. By the above configuration, it is possible to prevent a deterioration of the frequency characteristics caused by the gate capacitance of the P-MOS transistors mp1 and mp2 which constitute the first and second current mirror circuits CM1 and CM2, respectively. The resistors R1 and R2 inserted into the gates are caused to have the frequency characteristics in the input impedance.

Figure 29:
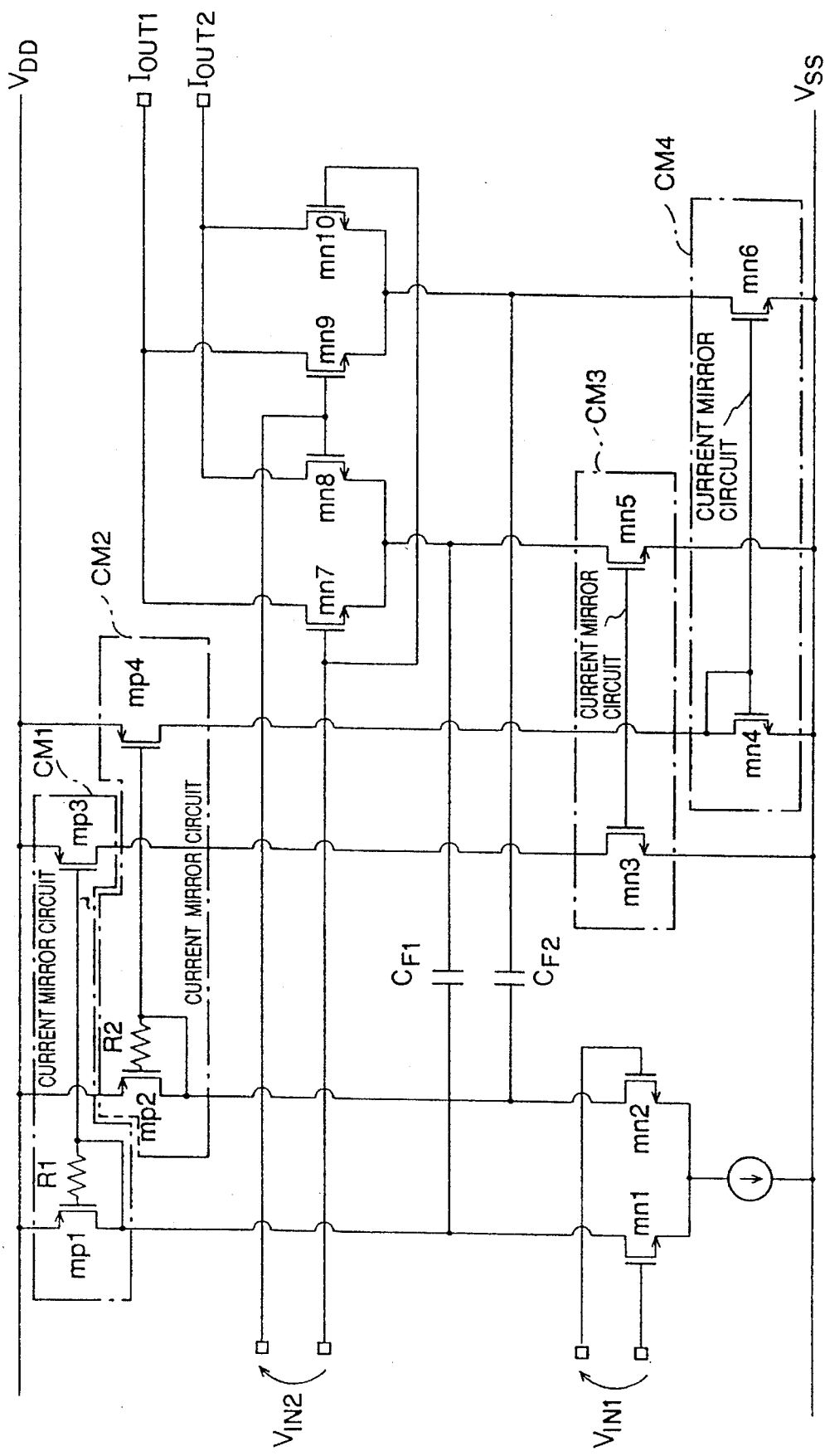
FIG. 29 is a circuit diagram showing an electronic circuit according to a twenty-fifth embodiment in which the present invention is applied to a multiplier.

Furthermore, FIG. 29 is a circuit diagram including current mirror circuits according to a twenty-fifth embodiment in which the present invention is applied to the multiplier shown in FIG. 2. In FIG. 29, resistors R1 and R2 are inserted into a gate of the P-MOS transistor mp1 of the first current mirror circuit CM1 and a gate of the P-MOS transistor mp3 of the second current mirror circuit CM2, respectively, for preventing the deterioration of the frequency characteristics caused by the gate capacitance. Furthermore, a feedforward capacitance $C_{F1}$ is provided in the manner of connecting a drain of a P-MOS transistor mp1 of the first current mirror circuit CM1 and a drain of an N-MOS transistor mn5 of the third current mirror circuit CM3. A feedforward capacitance $C_{F2}$ is provided in the manner of connecting a drain of a P-MOS transistor of the second current mirror circuit CM2 and a drain of an N-MOS transistor mn6 of the fourth current mirror circuit CM4.

By the feedforward circuit including the capacitance provided in the above configuration, it is possible to avoid the deterioration of the frequency characteristics caused by the gate capacitance of the N-MOS transistors mn3 and mn4 of the third and fourth current mirror circuit CM3 and CM4.

What is claimed is:

1. An electronic circuit including signal current reflection means having an input portion and an output portion comprising:

voltage-current conversion means for generating an output current in proportion with an input voltage;

said signal current reflection means including the input portion having an input terminal for receiving the output current from said voltage-current conversion means and the output portion for outputting the current after reflection, and including low frequency signal passing means provided between a control electrode of a transistor constituting said input portion and a control electrode of a transistor constituting said output portion and for passing through a low frequency signal component occurring in said control electrodes of said transistors; and feedforward means provided between said input terminal of the input portion of the signal current reflection means and an output stage of the electronic circuit and for causing a high frequency signal component supplied to the signal current reflection means to flow into the output stage wherein said output portion is coupled to said output stage.

2. The electronic circuit including the signal current reflection means according to claim 1, wherein said signal current reflection means comprises current mirror circuits each of which includes an input portion having an input transistor, an output portion having an output transistor, low frequency signal passing means which is arranged between a control terminal of said input transistor and a control terminal of said output transistor, and high frequency signal passing means which is arranged between an input terminal of said input portion thereof and an output stage of said electronic circuit; and a signal transmission path is divided into a first transmission path including said low frequency signal passing means for transmitting a low frequency signal component of said signal current, and a second transmission path including said high frequency signal passing means for transmitting a high frequency component of said signal current.

3. The electronic circuit including the signal current reflection means according to claim 1, wherein said signal current reflection means comprises current mirror circuits including said low frequency signal passing means which is connected to a gate or base electrode of a transistor in which at least an input current is flowing in the current mirror circuit, and high frequency signal passing means is provided between an element constituting an output stage of said electronic circuit and said input terminal of said current mirror circuit for passing through a high frequency signal component.

4. The electronic circuit including the signal current reflection means according to claim 1, wherein said signal current reflection means comprises current mirror circuits including a bandwidth limit circuit which is connected to a gate or base electrode of a transistor in which at least an input current is flowing in the current mirror circuit, and a signal transmission path is provided by a capacitive element between said input terminal of said current mirror circuit and said output stage of said electronic circuit.

5. The electronic circuit including the signal current reflection means according to claim 4, wherein said bandwidth limit circuit includes a low pass filter comprised of a resistor and capacitor.

6. The electronic circuit including the signal current reflection means according to claim 5, wherein said low pass filter circuit is limited in bandwidth by a capacitance value of a gate or base capacitance of the transistor to which at least an input current is flowing in said current mirror circuit.

7. The electronic circuit including the signal current reflection means according to claim 5, wherein said low pass filter circuit includes a resistor element having a resistance value larger than that of a parasitic resistance of a base or gate electrode of a transistor to which at least an output current is flowing in said current mirror circuit.

8. The electronic circuit including the signal current reflection means according to claim 5, wherein said signal transmission path includes a capacitive element having a capacitance value larger than that of said capacitor constituting a low pass filter included in said bandwidth limit circuit.

9. The electronic circuit including the signal current reflection means according to claim 8, wherein said low pass filter circuit is limited in bandwidth by a capacitance value of a gate or base capacitance of the transistor to which at least an input current is flowing in said current mirror circuit.

10. The electronic circuit including the signal current reflection means according to claim 8, wherein said low pass filter circuit includes a resistor element having a resistance value larger than that of a parasitic resistance of a base or gate electrode of a transistor to which at least an output current is flowing in said current mirror circuit.

* * * * *